(12) United States Patent
Lim et al.

(10) Patent No.: US 11,195,928 B2
(45) Date of Patent: Dec. 7, 2021

(54) SEMICONDUCTOR DEVICES INCLUDING A GATE ISOLATION STRUCTURE AND A GATE CAPPING LAYER INCLUDING DIFFERENT MATERIALS FROM EACH OTHER

(71) Applicant: SAMSUNG ELECTRONICS CO., LTD., Suwon-si (KR)

(72) Inventors: Kangmook Lim, Seoul (KR); Sangsu Kim, Yongin-si (KR); Wooseok Park, Ansan-si (KR); Daekwon Joo, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/822,275

(22) Filed: Mar. 18, 2020

(65) Prior Publication Data

US 2021/0036121 A1 Feb. 4, 2021

(30) Foreign Application Priority Data

Jul. 30, 2019 (KR) .................. 10-2019-0092590

(51) Int. Cl.
*H01L 29/423* (2006.01)
*H01L 27/088* (2006.01)
(Continued)

(52) U.S. Cl.
CPC .... *H01L 29/42392* (2013.01); *H01L 27/0886* (2013.01); *H01L 29/0673* (2013.01);
(Continued)

(58) Field of Classification Search
CPC ......... H01L 21/02603; H01L 21/76224; H01L 21/823481; H01L 21/823878;
(Continued)

(56) References Cited

U.S. PATENT DOCUMENTS 8,735,991 B2 5/2014 Shieh et al.
8,846,491 B1 9/2014 Pham et al.
(Continued)

*Primary Examiner* — David C Spalla
(74) *Attorney, Agent, or Firm* — F. Chau & Associates, LLC

(57) ABSTRACT

A semiconductor device is provided including an active region on a substrate A plurality of channel layers is spaced apart on the active region. Gate structures are provided. The gate structures intersect the active region and the plurality of channel layers. The gate structures surround the plurality of channel layers. Source/drain regions are disposed on the active region on at least one side of the gate structures. The source/drain regions contact with the plurality of channel layers. A lower insulating layer is disposed between side surfaces of the gate structures on the source/drain regions. Contact plugs penetrate through the lower insulating layer. The contact plugs contact the source/drain regions. An isolation structure intersects the active region on the substrate and is disposed between the source/drain regions adjacent to each other. Each of the gate structures includes a gate electrode and a gate capping layer including materials different from each other.

20 Claims, 25 Drawing Sheets

(51) Int. Cl.
  *H01L 29/06* (2006.01)
  *H01L 29/08* (2006.01)
  *H01L 29/10* (2006.01)
  *H01L 29/66* (2006.01)
  *H01L 21/8234* (2006.01)
  *H01L 21/762* (2006.01)
  *H01L 21/306* (2006.01)

(52) U.S. Cl.
  CPC ...... *H01L 29/0847* (2013.01); *H01L 29/1037* (2013.01); *H01L 21/30604* (2013.01); *H01L 21/76224* (2013.01); *H01L 21/823418* (2013.01); *H01L 21/823431* (2013.01); *H01L 21/823462* (2013.01); *H01L 21/823481* (2013.01); *H01L 29/6656* (2013.01); *H01L 29/66545* (2013.01); *H01L 29/66553* (2013.01)

(58) Field of Classification Search
  CPC ............ H01L 27/0886; H01L 29/0649; H01L 29/0665; H01L 29/0669; H01L 29/0673; H01L 29/0847; H01L 29/1037; H01L 29/42392; H01L 29/66545; H01L 29/66553; H01L 29/6656; H01L 21/30604; H01L 21/823418; H01L 21/823431; H01L 21/823462; H01L 21/823821; H01L 21/845; H01L 27/0924; H01L 27/10879; H01L 27/1211; H01L 29/41791; H01L 29/66439; H01L 29/66795; H01L 29/775; H01L 29/785; H01L 29/7851; H01L 29/7853; H01L 29/7855; H01L 2029/7858
  See application file for complete search history.

(56) References Cited

U.S. PATENT DOCUMENTS

| | | | |
|---|---|---|---|
| 9,406,676 | B2 | 8/2016 | Yu et al. |
| 9,653,583 | B1 | 5/2017 | Zhao et al. |
| 9,865,704 | B2 | 1/2018 | Xie et al. |
| 10,128,240 | B2 | 11/2018 | Min et al. |
| 10,157,800 | B2 | 12/2018 | Chang et al. |
| 10,665,669 | B1 * | 5/2020 | Xie .................. H01L 29/42392 |
| 2017/0287933 | A1 | 10/2017 | Chen et al. |
| 2018/0374851 | A1 | 12/2018 | Wang et al. |
| 2019/0043964 | A1 * | 2/2019 | Lin .................... H01L 29/0649 |
| 2020/0006559 | A1 * | 1/2020 | Mehandru ............ H01L 27/088 |

* cited by examiner

SEMICONDUCTOR DEVICES INCLUDING A GATE ISOLATION STRUCTURE AND A GATE CAPPING LAYER INCLUDING DIFFERENT MATERIALS FROM EACH OTHER

CROSS-REFERENCE TO RELATED APPLICATION

This application claims priority under 35 U.S.C. § 119 to Korean Patent Application No. 10-2019-0092590 filed on Jul. 30, 2019 in the Korean Intellectual Property Office, the disclosure of which is incorporated by reference herein in its entirety.

TECHNICAL FIELD

The present inventive concept relates to semiconductor devices including a gate isolation structure and a gate capping layer including different materials from each other.

DISCUSSION OF THE RELATED ART

As demand for high performance, high speed, and multifunctionality in semiconductor devices has increased, the integration density of semiconductor devices has also increased. When semiconductor dev ices having micropatterns are manufactured to keep pace with the trend for high integration density of semiconductor devices, the micropatterns require a microwidth or a microdistance therebetween. However, operational properties may be compromised owing to a reduced size of planar metal-oxide-semiconductor field-effect transistors (MOSFETs). Thus, semiconductor devices including fin field effect transistors (FinFETs), including a channel having a three-dimensional structure, have also been developed.

SUMMARY

According to an exemplary embodiment of the present inventive concept, a semiconductor device is provided including an active region on a substrate. A plurality of channel layers is spaced apart on the active region. Gate structures are provided. The gate structures intersect the active region and the plurality of channel layers. The gate structures surround the plurality of channel layers. Source/drain regions are disposed on the active region on at least one side of the gate structures. The source/drain regions contact with the plurality of channel layers. A lower insulating layer is disposed between side surfaces of the gate structures on the source/drain regions. Contact plugs penetrate through the lower insulating layer. The contact plugs contact the source/drain regions. An isolation structure intersects the active region on the substrate and is disposed between the source/drain regions adjacent to each other Each of the gate structures includes a gate electrode and a gate capping layer including materials different from each other.

According to an exemplary embodiment of the present inventive concept, the isolation structure and the lower insulating layer include materials different from each other.

According to an exemplary embodiment of the present inventive concept, the isolation structure includes SiO, SiN, SiCN, SiOC, SiON, and/or SiOCN.

According to an exemplary embodiment of the present inventive concept, side surfaces of the isolation structure are in contact with the source/drain regions adjacent to each other.

According to an exemplary embodiment of the present inventive concept, a lower end of the isolation structure is disposed below a lower end of the active region.

According to an exemplary embodiment of the present inventive concept, each of the gate structures comprises spacer layers disposed on side surfaces of the gate electrode.

According to an exemplary embodiment of the present inventive concept, tipper surfaces of the spacer layers and an upper surface of the gate capping layer are substantially coplanar with each other.

According to an exemplary embodiment of the present inventive concept, at least a portion of the spacer layers is disposed on side surfaces of the isolation structure.

According to an exemplary embodiment of the present inventive concept, internal spacer layers are disposed on opposite sides of the gate structure in the first direction and on lower surfaces of each of the plurality of channel layers. The internal spacer layers have external side surfaces substantially coplanar with external side surfaces of the plurality of channel layers.

According to an exemplary embodiment of the present inventive concept, the isolation structure is in contact with the lower insulating layer and the source/drain regions.

According to an exemplary embodiment of to on exemplary embodiment of the present inventive concept, a semiconductor device is provided including an active region. A plurality of transistors is spaced apart from each other in a first direction on the active region. Each of the plurality of transistors includes a channel structure on the active region, a gate structure at least partially surrounding the channel structure, source/drain regions in contact with the channel structure on the active region, and internal spacer layers disposed between the channel structures. An isolation structure extends towards the active region. The isolation structure is in contact with at least one of the gate structure, the channel structure, and the internal spacer layers. The isolation structure separates the plurality of transistors from each other. The gate structure includes a gate electrode and a gate capping layer on the gate electrode. An upper surface of the isolation structure is disposed higher than an upper surface of the gate electrode. The gate isolation structure and the gate capping layer include materials different from each other.

According to an exemplary embodiment of the present inventive concept, an upper surface of the gate capping layer is substantially coplanar with the upper surface of the isolation structure.

According to an exemplary embodiment of the present inventive concept, the gate structure comprises gate spacer layers on side surfaces of the gate electrode. Each of the gate spacer layers has an upper surface substantially coplanar with an upper surface of the isolation structure.

According to an exemplary embodiment of the present inventive concept, a portion of side surfaces of the isolation structure is in contact with side surfaces of each of the source/drain regions.

According to an exemplary embodiment of the present inventive concept, a width of an upper surface of the isolation structure in the first direction is greater than a width of the gate electrode in the first direction.

According to an exemplary embodiment of the present inventive concept, isolation spacer layers are disposed on side surfaces of the isolation structures and include the same material us the gate spacer layers.

According to an exemplary embodiment of the present inventive concept, the contact plugs are in contact with upper portions of the source/drain regions and overlap a portion of the gate spacer layers. At least one of the contact plugs is in contact with an edge of an upper surface of the isolation structure.

According to an exemplary embodiment of the present inventive concept, a semiconductor device is provided including an active region on a substrate. Gate structures, including gate electrodes, are disposed on the active region. A gate capping layer covers upper portions of the gate electrodes. Source/drain regions are disposed on the active region on at least one side of the gate electrodes and in contact with the plurality of channel layers. An isolation structure extends in a first direction perpendicular to an upper surface of the substrate. The isolation structure is disposed on at least one side of the source/drain regions separating the source/drain regions adjacent to each other the isolation structure includes a material different from a material of the gate capping layer.

According to an exemplary embodiment of the present inventive concept, a lower end of the isolation structure is disposed below a lower end of the active region by a first depth According to an exemplary embodiment of the present inventive concept, gate spacer layers extend in the first direction perpendicular to the upper surface of the substrate. The gate spacer layers are disposed on at least one side of the gate electrodes. Isolation spacer layers extend in the first direction perpendicular to the upper surface of the substrate. The isolation spacer layers are disposed on at least one side of the isolation structure. The isolation spacer layers are formed of the same material as the gate spacer layers.

BRIEF DESCRIPTION OF DRAWINGS

The above and other aspects of the present inventive concept will be more clearly understood from the following detailed description, taken in conjunction with the accompanying drawings, in which.

DETAILED DESCRIPTION OF THE EMBODIMENTS

Hereinafter, example embodiments of the present inventive concept will be described with reference to the accompanying drawings.

Figure 1:
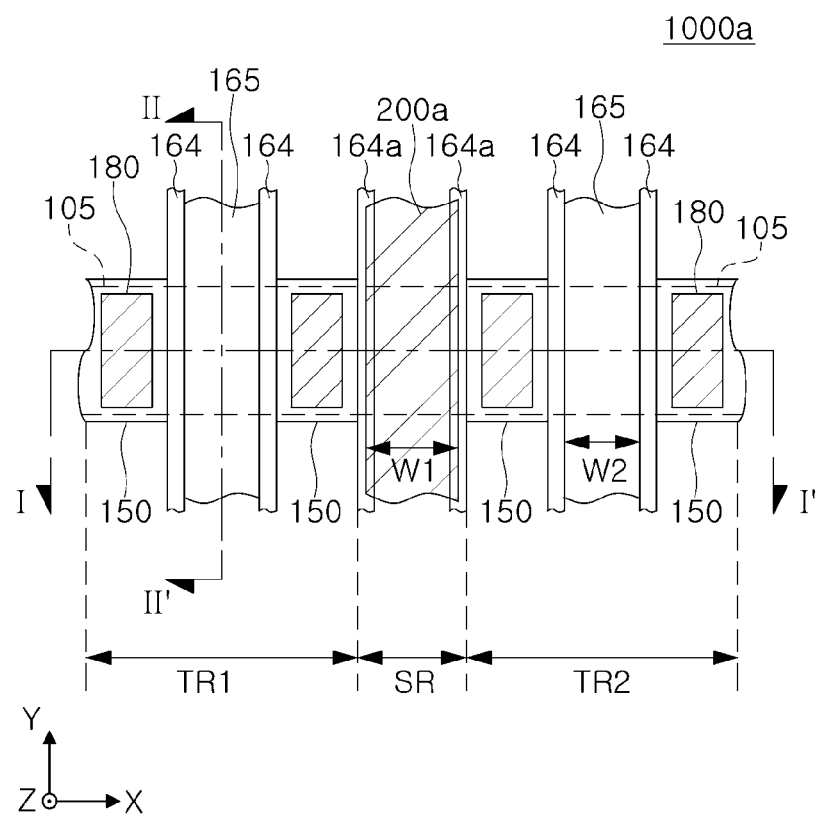
FIG. 1 is a plan view illustrating a semiconductor device according to an example embodiment of the present inventive concept.

FIG. 1 is a plan view illustrating a semiconductor device according to example embodiments of the present inventive concept.

Figure 2:
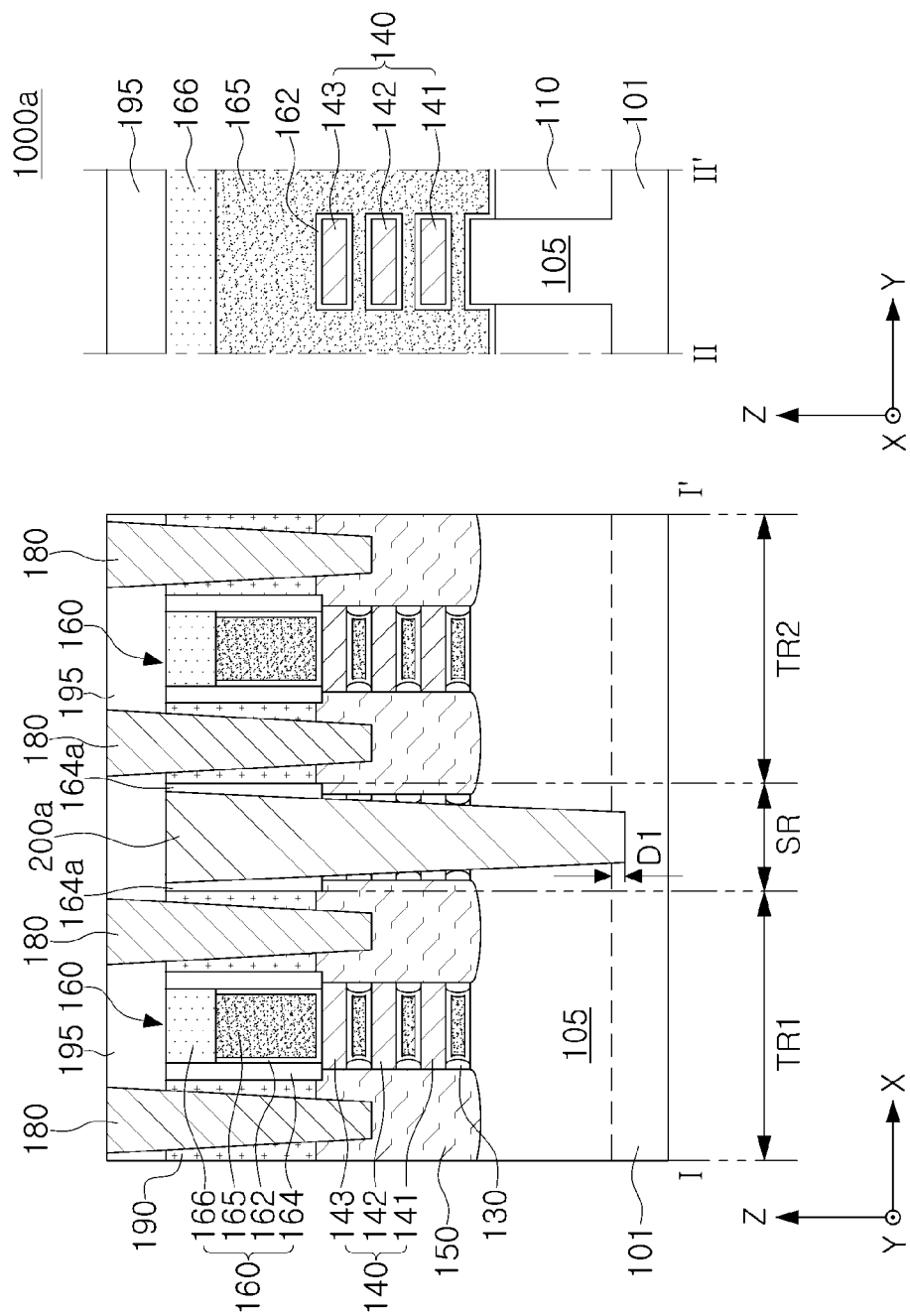
FIGS. 2 to 4 are cross-sectional views illustrating semiconductor devices according to example embodiments of the present inventive concept.

FIG. 2 is a cross-sectional view illustrating a semiconductor device according to example embodiments of the present inventive concept. FIG. 2 illustrates cross sections taken along lines I-I' and II-II' of the semiconductor device in FIG. 1.

Referring to FIGS. 1 and 2, a semiconductor device 1000a may include a substrate 101. An active region 105 may be disposed on the substrate 101. Channel structures 140 including a plurality of channel layers 141, 142, and 143 may be disposed on the active region 105 to be spaced apart from each other vertically in a third direction (e.g., a Z direction). Source/drain regions 150 may be disposed in contact with the plurality of channel layers 141, 142, and 143. Gate structures 160 may extend intersecting the active region 105. Contact plugs 180 may be connected to the source/drain regions 150, and an isolation structure 200a may be disposed between the source-drain regions 150. The semiconductor device 1000a may further include device isolation layers 110.

The device isolation layer 110 may be disposed at opposing sides of the active region 105 in a second direction (e.g., a Y direction), internal spacer layers 130 may be disposed on opposing sides of the plurality of channel structures 141, 142, and 143 in a first direction (e.g., an X direction). A lower insulating layer 190 may be disposed on an upper surface of the source/drain regions 150, and an upper insulating layer 195 may be disposed on an upper surface of the lower insulating layer 190. The gate structure 160 may include a gate dielectric layer 162, a gate electrode 165, gate spacer layers 164, and a gate capping layer 166.

The semiconductor dev ice 1000a may include a plurality of transistors, and a plurality of regions, including respective transistors, may be defined. In addition, a plurality of other regions may be defined in the semiconductor device 1000a to separate the respective transistors. For example, in the semiconductor device 1000a, a first transistor region TR1, a second transistor region TR2, and an isolation region SR between the first transistor region TR1 and the second transistor region TR2 are defined on the substrate 101. Each of the first and second transistor regions TR1 and TR2 may include a channel structure 140 on the active region 105, a gate structure 160 surrounding the channel structure 140, and source-drain regions 150 disposed to be in contact with the channel structure 140 on the active region 105. The first and second transistors TR1 and TR2 may be an NMOS region and a PMOS region, respectively. Alternatively, the first and second transistors TR1 and TR2 may be the same type of transistor region. The isolation region SR may separate the first transistor region TR1 and the second transistor region TR2 from each other in the first direction (e.g., the X direction).

The isolation region SR may include isolation spacer layers 164a and an isolation structure 200a. For example, the isolation spacer layers 164a may be disposed at opposing sides of the isolation structure 200a in the first direction (e.g., the X direction). The isolation structure 200a and the isolation spacer layers 164a may have a tapered shape.

In the semiconductor device 1000a, the active region 105 may have a fin structure. The gate electrode 165 may be disposed between the active region 105 and the channel structure 140, between the plurality of channel layers 141, 142, and 143 of the channel structures 140, and on an upper portion of the channel structure 140. Accordingly, the semiconductor device 1000a may include a gate-all-around field effect transistor formed by the channel structures 140, the source/drain regions 150, and the gate structures 160.

The substrate 101 may have an upper surface, a plane of which may be defined by the first direction (e.g., the x direction) and the second direction (e.g., the Y direction).

The substrate 101 may include a semiconductor material, for example, a group IV semiconductor, a group III-V compound semiconductor, and or a group II-VI compound semiconductor. For example, the group IV semiconductor may include silicon, germanium or silicon-germanium. The substrate 101 may be provided as a bulk wafer, an epitaxial layer, a silicon on insulator (SOI) layer, a semiconductor on insulator (SeOI) layer, or the like.

The device isolation layer 110 may define an active region 105 in the substrate 101. The device isolation layer 110 may be formed by, for example, a shallow trench isolation (STI) process. In example embodiments of the present inventive concept, the device isolation layer 110 may further include a region having a step with respect to a lower portion of the substrate 101 and extending deeper. The device isolation layer 110 may expose a portion of an upper portion of the active region 105. In example embodiments of the present inventive concept, the device isolation layer 110 may have a curved upper surface having a higher level in a direction toward the active region 105. The device isolation layer 110 may be formed of an insulating material. The device isolation layer 110 may be, for example, an oxide, a nitride, and/or a combination thereof.

The active region 105 is defined by the device isolation layer 110 in the substrate 101 and may be disposed to extend in the first direction (e.g., the X direction). The active region 105 may have a structure protruding from the substrate 101. An upper end of the active region 105 may be disposed to protrude to a predetermined height from an upper surface of the device isolation layer 110. The active region 105 may be formed us a portion of the substitute 101 or may include an epitaxial layer grown from the substrate 101.

However, a portion of the active region 105 on the substrate 101 may be recessed on opposite sides of the gate structures 160, and the source/drain regions 150 may be disposed on the recessed active region 105. The active region 105 may include impurities or doped regions including impurities. The recessed active regions 105 may be curved downwards in the third direction (e.g., the Z direction) towards an upper surface of the substrate 101.

The channel structure 140 may include two or more channel layers, first to third channel layers 141, 142, and 143, disposed on the acme region 105 to be spaced apart from each other in a direction perpendicular to an upper surface of the active region 105, for example, in the third direction (e.g., the Z direction). The first to third channel layers 141, 142, and 143 may be connected to the source/drain region 150 and may be spaced apart from the top surface of the active region 105.

The first to third channel layers 141, 142, and 143 may have the same or a similar width to the active region 105 in the second direction (e.g., the Y direction), and may have the same or a similar width to the gate structure 160 in the first direction (e.g., the X direction). However, in example embodiments of the present inventive concept, the first to third channel layers 141, 142, and 143 may have a reduced width such that side surfaces thereof are disposed below the gate structure 160 in the first direction (e.g., the X direction).

The first to third channel layers 141, 142, and 143 may formed of a semiconductor material and may include, for example, silicon (Si), silicon germanium (SiGe), and or germanium (Ge). The first to third channel layers 141, 142, and 143 may be formed of, for example, the same material us the substrate 101. In example embodiments of the present inventive concept, the first to third channel layers 141, 142, and 143 may include an impurity region formed in a region adjacent to the source/drain region 150. The number and shape of the channel layers 141, 142, and 143, constituting a single channel structure 140, may vary in example embodiments of the present inventive concept. For example, in example embodiments of the present inventive concept, the channel structure 140 may further include u channel layer disposed on the upper surface of the active region 105.

The source/drain regions 150 may be disposed on the active region 105 on opposite sides of the channel structure 140. The source/drain region 150 may be disposed to cover the upper surface of the active region 105, side surfaces of each of the first to third channel layers 141, 142, and 143 of the channel structure 140. The source/drain region 150 may be formed by recessing a portion of an upper portion of the active region 105. In example embodiments of the present inventive concept, the recess and a depth of the recess may be variously changed. The source, drain regions 150 may be a semiconductor lam including silicon (Si), and may include different types and/or concentrations of impurities.

The gate structure 160 may be disposed on the active region 105 and the channel structures 140 and may extend in the second direction (e.g., the Y direction) intersecting the active region 105 and the channel structures 140. Channel regions of transistors may be formed in the active region 105 and the channel structures 140 intersecting the gate structure 160. The gate structure 160 includes a gate electrode 165, a gate dielectric laser 162 between the gate electrode 165 and the plurality of channel layers 141, 142, and 143, a gate spacer layers 164 on side surfaces of the gate electrode 165, a gate capping layer 166 on an upper surface of the gate electrode 165.

The gate dielectric layer 162 may be disposed between the active region 105 and the gate electrode 165 and between the channel structure 140 and the gate electrode 165, and may be disposed to cover at least a portion of surfaces of the gate electrode 165. For example, the gate dielectric layer 162 may be disposed to surround all surfaces of the gate electrode 165 except the upper surface of the gate electrode 165. The upper surface of the gate electrode 165 may be covered by the gate capping layer 166. The gate dielectric layer 162 may extend between the gate electrode 165 and the gate spacer layers 164 in the third direction (e.g., the Z direction), but extension of the gate dielectric layer 162 is not limited thereto. The gate dielectric layer 162 may include an oxide, a nitride, and/or a high-k dielectric. The "high-k dielectric" may refer to a dielectric substance basing a higher dielectric constant than a silicon oxide ($SiO_2$). The high-k dielectric may be, for example, an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and or a praseodymium oxide ($Pr_2O_3$).

The gate electrode 165 may be disposed to extend higher upwardly in the third direction (e.g., the Z direction) in relation to the channel structure 140 while filling a space between the plurality of channel layers 141, 142, and 143 on the active region 105. The gate electrode 165 may be spaced apart from the plurality of channel layers 141, 142, and 143 by the gate dielectric layer 162. The gate electrode 165 may include a conductive material, for example, a metal nitride such as a titanium nitride (TiN), a tantalum nitride (TaN), or a tungsten nitride (WN), a metal material such as aluminum (Al), tungsten (W), or molybdenum (Mo), and/or a semiconductor material such as doped polysilicon. The gate electrode 165 may have a multilayer structure including two or more layers.

The gate spacer layers 164 may be disposed on opposite sides adjacent to the gate electrode 165 and may extend in the third direction (e.g., the Z direction), perpendicular to the upper surface of the substrate 101. The gate spacer layers 164 may insulate the source/drain regions 150 and the gate electrodes 165 from each other. In example embodiments of the present inventive concept, the gate spacer layers 164 may have a multilayer structure. The gate spacer layers 164 may be formed of an oxide, a nitride, and/or an oxynitride. For example, the gate spacer layers 164 may be formed of a low-k dielectric.

The gate capping layer 166 may be disposed on the gate electrode 165. The gate capping layer 166 may be disposed to extend in the second direction (e.g., the Y direction) along an upper surface of the gate electrode 165. Side surfaces of the gate capping layer 166 may be surrounded by upper portions of the gate spacer layers 164. The upper surface of the gate capping layer 166 may be substantially coplanar with upper surfaces of the gate spacer layers 164 and an upper surface of a lower insulating layer 190 to be described later, but the present inventive concept is not limited thereto. The gate capping layer 166 may include a material having a different etching selectivity with respect to the lower insulating layer 190 or the upper insulating layer 195, to be described later. The gate capping layer 166 may be formed of an oxide, a nitride, or an oxynitride and, for example, may include SiO, SiN, SiCN, SiOC, SiON, and, or SiOCN.

Internal spacer layers 130 may be disposed at parallel sides of the gate electrode 165 between the channel structures 140. For example, the internal spacer layers 130 may be disposed on opposite sides of the gate electrode 165 and may contact adjacent channel structures 140 in the first direction (e.g., the X direction) on a lower surface of each of the first to third channel layers 141, 142, and 143. The internal spacer layers 130 may have external side surfaces, substantially coplanar with external side surfaces of the first to third channel layers 141, 142, and 143. For example, outer surfaces of the internal spacer layers 130 and the channel layers 141, 142, and 143 may be aligned in the third direction (e.g., the Z direction). Below the third channel layer 143, the gate electrode 165 may be spaced apart from the source/drain regions 150 by the internal spacer layers 130 to be electrically isolated therefrom. Each of the internal spacer layers 130 may have a shape in which a side surface, facing the gate electrode 165, is convexly rounded inwardly towards the gate electrode 165, but a shape of each of the internal spacer layers 130 is not limited thereto. The internal spacer layers 130 may be formed of an oxide, a nitride, and or an oxynitride. For example, the internal spacer layers 130 may be formed of a low-k dielectric.

The contact plug 180 may be connected to the source/drain region 150. For example, the contact plug 180 may penetrate through the upper insulating layer 195, the source/drain regions 150, and the lower insulating law 190, and may apply an electrical signal to the source/drain region 150. The contact plug 180 may be disposed on the source/drain region 150, as illustrated in FIG. 1. In an example embodiment of the present inventive concept, the contact plug 180 may have a greater length than the source/drain region 150 in the second direction (e.g., the Y direction). The contact plug 180 may have an inclined side surface in which a width of a lower portion is narrower than a width of an upper portion according to an aspect ratio, but a shape of the side surface of the contact plug 180 is not limited thereto. The contact plug 180 may extend downwardly further than, for example, the third channel 143 from above. For example, a lower surface of the contact plug 180 may be lower than a lower surface of the third channel 143. The contact plug 180 may extend downwardly toward the substrate 101 to a height corresponding to, for example, an upper surface of the second channel layer 142, but the present inventive concept is not limited thereto. In example embodiments of the present inventive concept, the contact plug 180 may be disposed to be in contact with and extend along the upper surface of the source/drain region 150 without recessing the source/drain region 150. For example, a lower surface of the contact plug 180 and the upper surface of the source/drain region 150 may be coplanar. The contact plug 180 may include, for example, a metal nitride such as a titanium nitride (TiN), a tantalum nitride (TaN), or a tungsten nitride (WN) aluminum (Al), tungsten (W), and or molybdenum (Mo).

The lower insulating layer 190 may cover the source/drain regions 150 and the gate structures 160, and may be disposed to cover the device isolation layer 110 in a region of the semiconductor device 1000a. The lower insulating layer 190 may include, for example, an oxide, a nitride, and or an oxynitride. For example, the lower insulating layer 190 may include a low-k dielectric.

The upper insulating layer 195 may be disposed to cover upper surfaces of the lower insulating layer 190 and the gate structure 160. The lower insulating layer 195 may include, for example, an oxide, a nitride, and an oxynitride. For example, the upper insulating layer 195 may include a low-k dielectric.

The isolation structure 200a may intersect the active region 105 on the substrate 101 and extend in the second direction (e.g., the Y direction). The isolation structure 200a may also extend in a direction perpendicular to the upper surface of the substrate 101 in the third direction (e.g., the Z direction). The isolation structure 200a may be disposed between the source/drain regions 150 adjacent to each other. An upper surface of the isolation structure 200a may be substantially coplanar with an upper surface of the gate capping layer 166 and an upper surface of the gate spacer layer 164, and an upper end of the isolation structure 200a may be disposed at substantially the same height as an upper end of the gate capping layer 166, but dispositions thereof are not limited thereto.

In example embodiments of the present inventive concept, the isolation structure 200a may have an inclined side surface in which a width of a lower portion is narrower than a width of an upper portion according to an aspect ratio, but a shape of the side surface of the isolation structure 200a is not limited thereto. The lower portion of the isolation structure 200a may have a flat surface or may have a convex or a sharp shape facing towards the substrate 101, but a shape of the lower portion of the isolation structure 200a is not limited thereto.

In example embodiments of the present inventive concept, as illustrated in FIG. 1, a first width W1 of an upper surface of the isolation structure 200a in the first direction (e.g., the X direction) may be greater than a second width of the gate electrode 165 in the first direction (e.g., the X direction). The upper surface of the isolation structure 200a may be disposed higher than the upper surface of the gate electrode 165. A lower end of the isolation structure 200a may be disposed to be lower than lower ends of the source/drain regions 150. The lower end of the isolation structure 200a may be disposed to be lower than the lower end of the active region 105 by a predetermined depth. For example, the isolation structure 200a may extend upwardly from the substrate 101 in the third direction (e.g., the Z direction) to penetrate through the active region 105, and the lower end of the isolation structure 200a may be disposed to be lower than a lower end of the active region 105 by a first depth D1. For example, a lower end of the isolation structure 200a may partially penetrate the substrate 101. In an example embodiment of the present inventive concept, the lower end of the isolation structure 200a may be disposed to be lower than lower ends of the source/drain regions 150 and higher than a lower end of the active region 105, but the dispositions are not limited thereto.

The semiconductor device 1000a may further include isolation spacers 164a disposed at substantially the same level and extending with a same height as the gate spacer layers 164 in the third direction (e.g., the Z direction) perpendicular to the upper surfaces of the substrate 101. The isolation spacers 164a may be disposed on side surfaces of the isolation structure 200a, and extend in the third direction (e.g., the Z direction). The isolation spacers 164a may also be referred to herein as an isolation spacer layer 164a. A shape of the isolation spacer layer 164a may be the same as a shape in which a portion of the gate spacer layer 164 is removed on one side surface in the first direction (e.g., the X direction) by a predetermined width. For example, the isolation spacer layer 104a may have a portion overlapping the isolation structure 200a, and thus, one side surface of the isolation spacer layer 164a may be inclined with respect to the substrate 101. However, the shape of the isolation spacer layer 164a is not limited thereto, and the isolation spacer layer 164a may have the substantially same shape as the gate spacer layer 164 (e.g., a rectangular shape). A shape of the isolation spacer layer 164a may be substantially the same as a shape of the gate spacer layer 164, or may be substantially the same as a shape in which u portion of the gate spacer layer 164 after modification or further etching. In an example embodiment of the present inventive concept, the gate spacer layers 164 and the isolation spacer layers 164a may have substantially the same width in the first direction (e.g., the X direction). However, the present inventive concept is not limited thereto.

In an example embodiment of the present inventive concept, the isolation spacer layers 164a may be disposed on opposite sides of the isolation structure 200a and may have a multilayer structure. The isolation spacer layer 164a may be formed of an oxide, a nitride, and/or an oxynitride. For example, the isolation spacer layer 164a may include a low-k dielectric. In an example embodiment of the present inventive concept, the gate spacer layers 164 and the isolation spacer layers 164a may include the same material.

In an example embodiment of the present inventive concept, the side surfaces of the isolation structure 200a may not be in contact with respective side surface of adjacent source/drain regions 150. Thus, a portion of the channel structure 140 and a portion of the internal spacer layers 130, disposed to be in contact with side surfaces of the source/drain regions 150 facing the isolation structure 200a, may be disposed in a residual form on the side surfaces of the isolation structure 200a.

The isolation structure 200a may be disposed between adjacent source/drain regions 150 to prevent diffusion of impurities included in the adjacent source/drain regions 150. Adjacent isolation structures 200a may be spaced apart from each other in the first direction (e.g., the X direction) and may be disposed between transistors that include the channel structure 140, the source/drain regions 150, and the gate structure 160. Thus, the transistors may be separated from each other.

The isolation structure 200a may include an insulating material such as SiO, SiN, SiCN, SiOC, SiON, and or SiOCN.

The isolation structure 200a and the gate capping layer 166 may include materials different from each other. For example, the gate capping layer 166 may include SiN, and the isolation structure 200a may include SiOC, but materials of the isolation structure 200a and the gate capping layer 166 are not limited thereto. The isolation structure 200a and the lower insulating layer 190 may include materials different from each other. For example, the lower insulating layer 190 may include an oxide such as $SiO_2$, and the isolation structure 200a may include SiOC, but materials of the isolation structure 200a and the lower insulating layer 190 are not limited thereto.

Hereinafter, an example embodiment of the semiconductor device according to the present inventive concept will be described with reference to FIGS. 3 to 9. In FIGS. 3 to 9, the same descriptions as already described above with reference to FIGS. 1 and 2 will be omitted for brevity of description.

Figure 3:
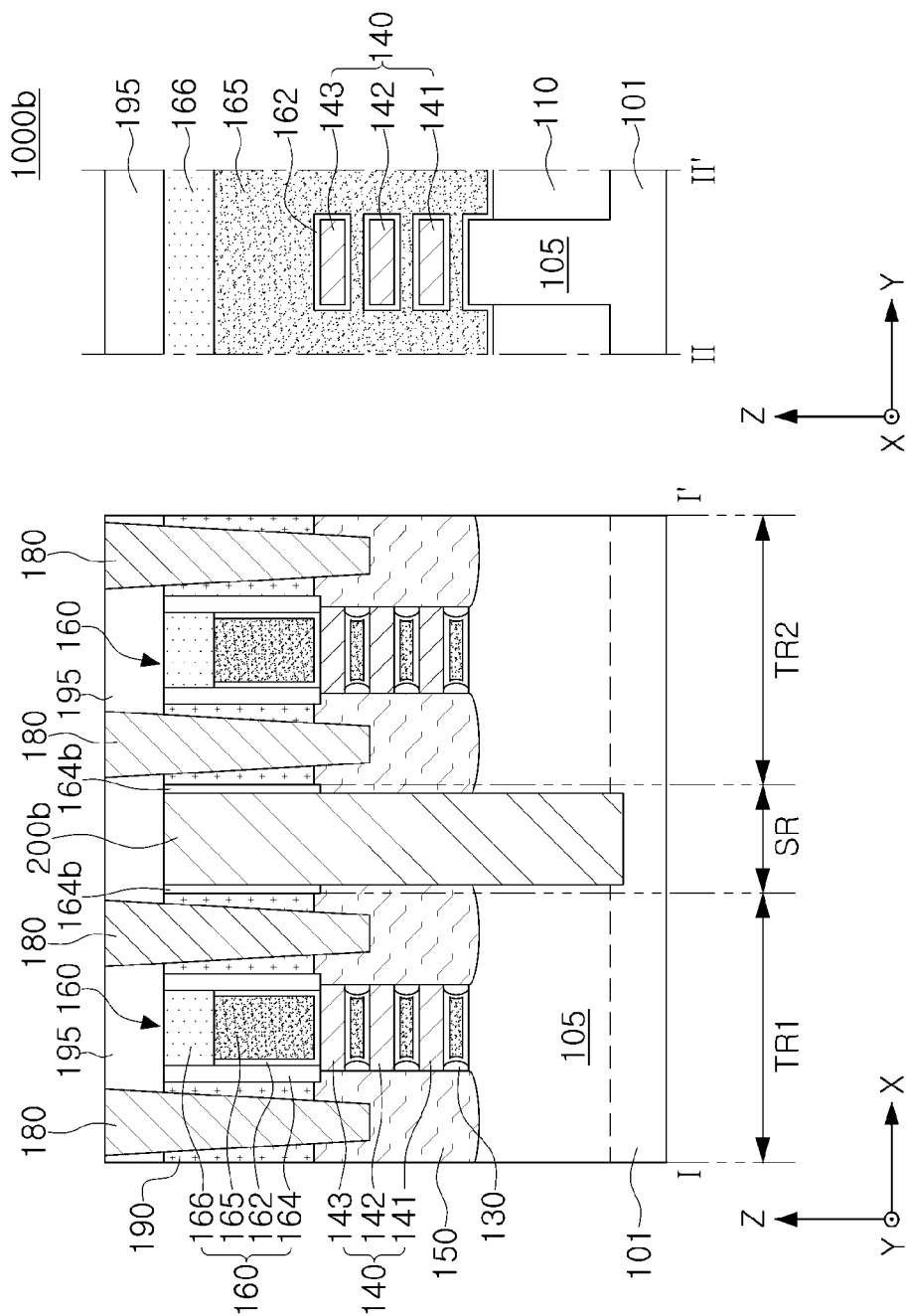

FIG. 3 is a cross-sectional view of a semiconductor device according to an example embodiment of the present inventive concept.

Referring to FIG. 3, unlike the example embodiment of the present inventive concept described above with reference to FIG. 2, a semiconductor device 1000b may include an isolation structure 200b. The isolation structure 200b may be disposed between adjacent source/drain regions 150, and both side surfaces of the isolation structure 200b may be in contact with a respective source/drain region 150. In an example embodiment of the present invention, a portion of a channel structure 140 and a portion of internal spacer layers 164b, disposed to be in contact with side surfaces of the source/drain regions 150 facing the isolation structure 200b, may not remain on the side surfaces of the isolation structure 200b.

In an example embodiment of the present inventive concept, the isolation spacer layers 164b may be disposed on both sides of the isolation structure 200b. A shape of the isolation spacer layer 164b may be the same as a shape in which the gate spacer layer 164 is removed on one side surface in the first direction (e.g., the X direction) by a predetermined width. For example, the shape of each of the isolation structure 200b and the isolation spacer layer 164b may be rectangular. The isolation spacer layers 164b may have a smaller width in the first direction (e.g., the X direction) than a width of the gate spacer layers 164. However, the shape of the isolation spacer layer 164b is not limited thereto, and may be the same as the shape of the gate spacer layers 164.

In an example embodiment of the present inventive concept, an isolation region SR may include isolation spacer layers 164b and an isolation structure 200b. An isolation structure 200b may be disposed between a first transistor region TR1 and a second transistor region TR2. Specifically, an isolation structure 200b may be disposed between first source/drain regions 150 and second source/drain regions 150 adjacent to each other. A portion of side surfaces of the isolation structure 200b may be in contact with side surfaces of each of the first and second source/drain regions 150.

Figure 4:
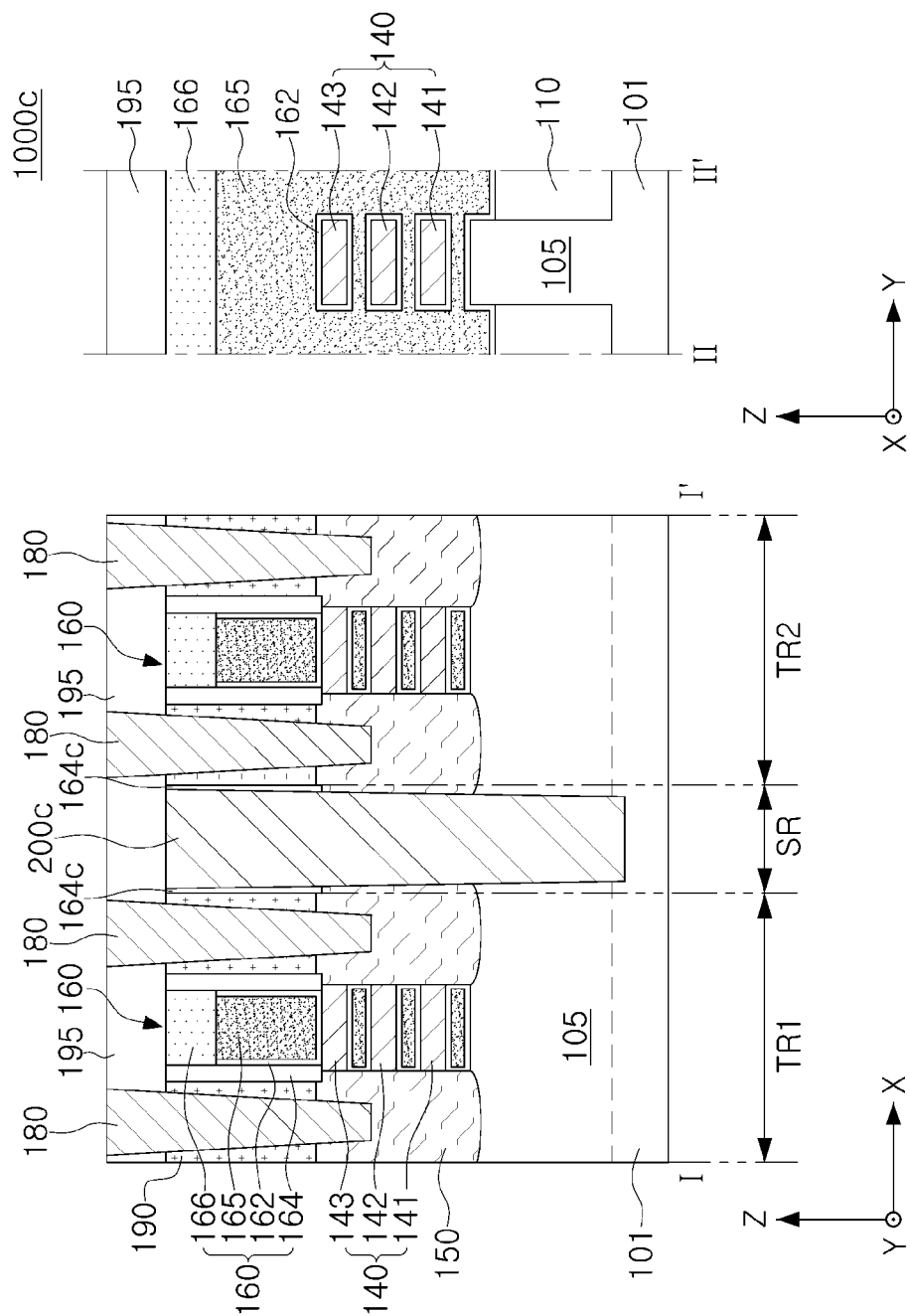

FIG. 4 is a cross-sectional view of a semiconductor device according to an example embodiment of the present inventive concept.

Referring to FIG. 4, unlike the example embodiment of the present inventive concept described above with reference to FIG. 2, a semiconductor device 1000c may not include the internal spacer layer 130. A gate electrode 165 may extend between first to third channel layers 141, 142, and 143 of the channel structure 140 in the first direction (e.g., the X direction) Accordingly, both side surfaces of the gate electrode 165 spaced apart in the first direction (e.g., the X direction) may be vertically disposed in parallel to both side surfaces of the channel structure 140 spaced apart in the first direction (e.g., the first direction), and may be substantially coplanar with both side surfaces of the channel structure 140. For example, the gate electrode 165 may have parallel side surfaces surrounded by an inner surface of the gate dielectric layer 162. An outer surface of the gate dielectric layer 162 at portions surrounding the parallel side surfaces of the gate electrode 165 may be aligned with side surfaces of the first to third channel layers 141, 142, and 143 stacked thereon.

An isolation structure 200c may be disposed between first source/drain regions 150 and second source/drain regions 150 adjacent to each other. A portion of side surfaces of the isolation structure 200c may be in contact with side surfaces of each of the first and second source/drain regions 150.

Figure 5A:
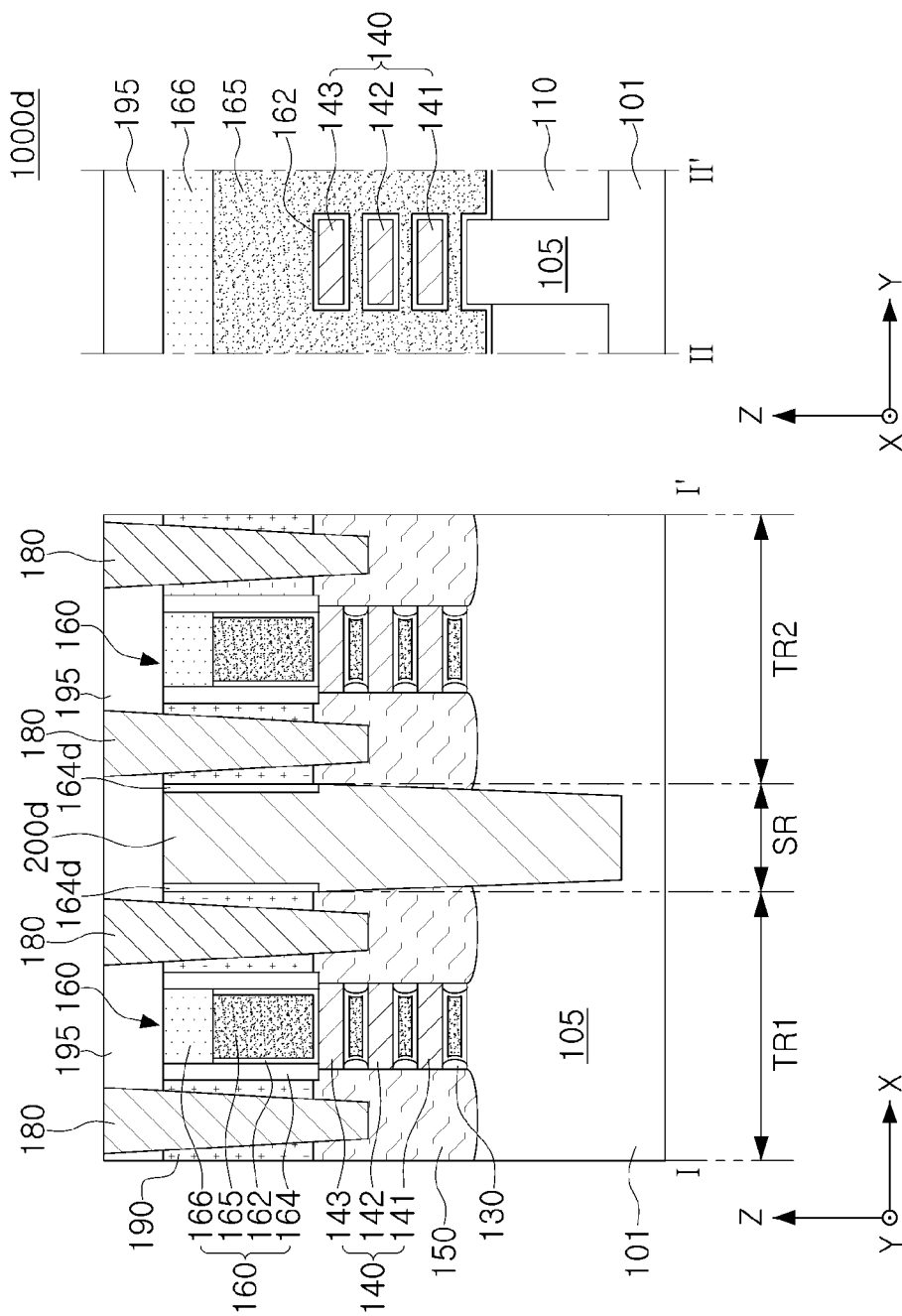
FIGS. 5A and 5B are cross-sectional views illustrating semiconductor devices according to example embodiments of the present inventive concept.
Figure 5B:
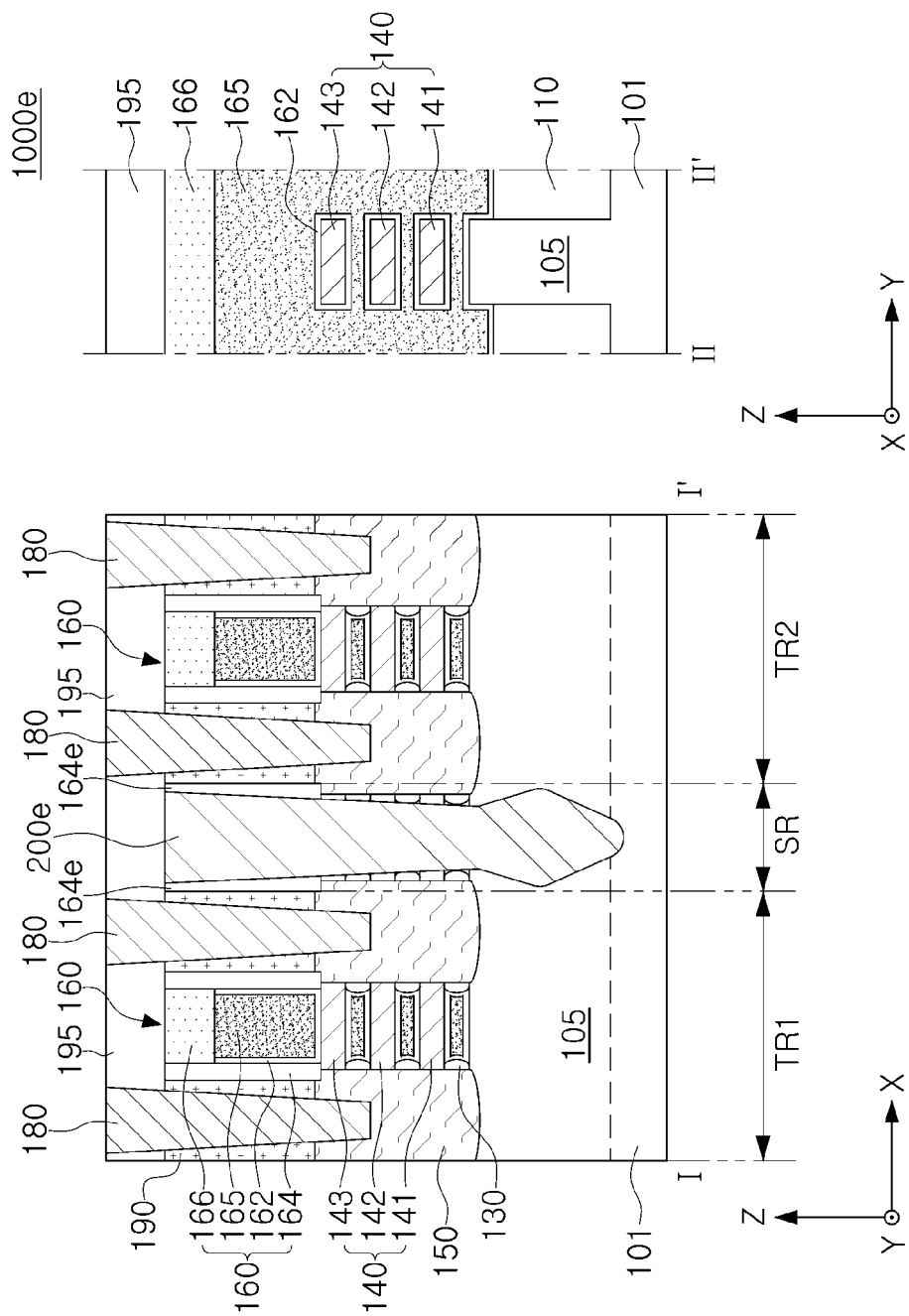

FIGS. 5A and 5B are cross-sectional views illustrating semiconductor devices in accordance with example embodiments of the present inventive concept.

Referring to FIG. 5A, unlike the example embodiment of the present inventive concept described above with reference to FIG. 2, a semiconductor device 1000d may include an isolation structure 200d having a portion that extends in the first direction (e.g., the X direction). For example, external surfaces of an upper portion of the isolation structure 200d may extend inwardly from each of adjacent source/drain regions 150. Accordingly, the isolation structure 200d may have a shape including a bent portion. For example, a lower portion of the isolation structure 200d may be wider in the first direction (e.g., the X direction) than an upper portion thereof. The level of the bent portion of the isolation structure 200d may be lower than an upper surface of the source/drain regions 150. The bent portion of the isolation structure 200d may be bent from side surfaces of isolation spacer layers 164d to be in contact with lower surfaces of isolation spacer layers 164d. Side surfaces of the lower portion of the isolation structure 200d may be in contact with opposing sides of the source/drain regions 150 adjacent to each other.

Referring to FIG. 5B, unlike the example embodiment of the present inventive concept described above with reference to FIG. 2, a semiconductor device 1000c may include an isolation structure 200c having a lower region, disposed to be lower than lower portions of source/drain regions 150, and having a different shape. For example, as illustrated in FIG. 5B, side surfaces of the lower region of the isolation structure 200e may have a shape, convexly extending to lower regions of source/drain regions 150. For example, the isolation structure 200e may have a rhomboidal protrusion extending from a lower portion thereof and at least partially penetrating the substrate 101.

Figure 6:
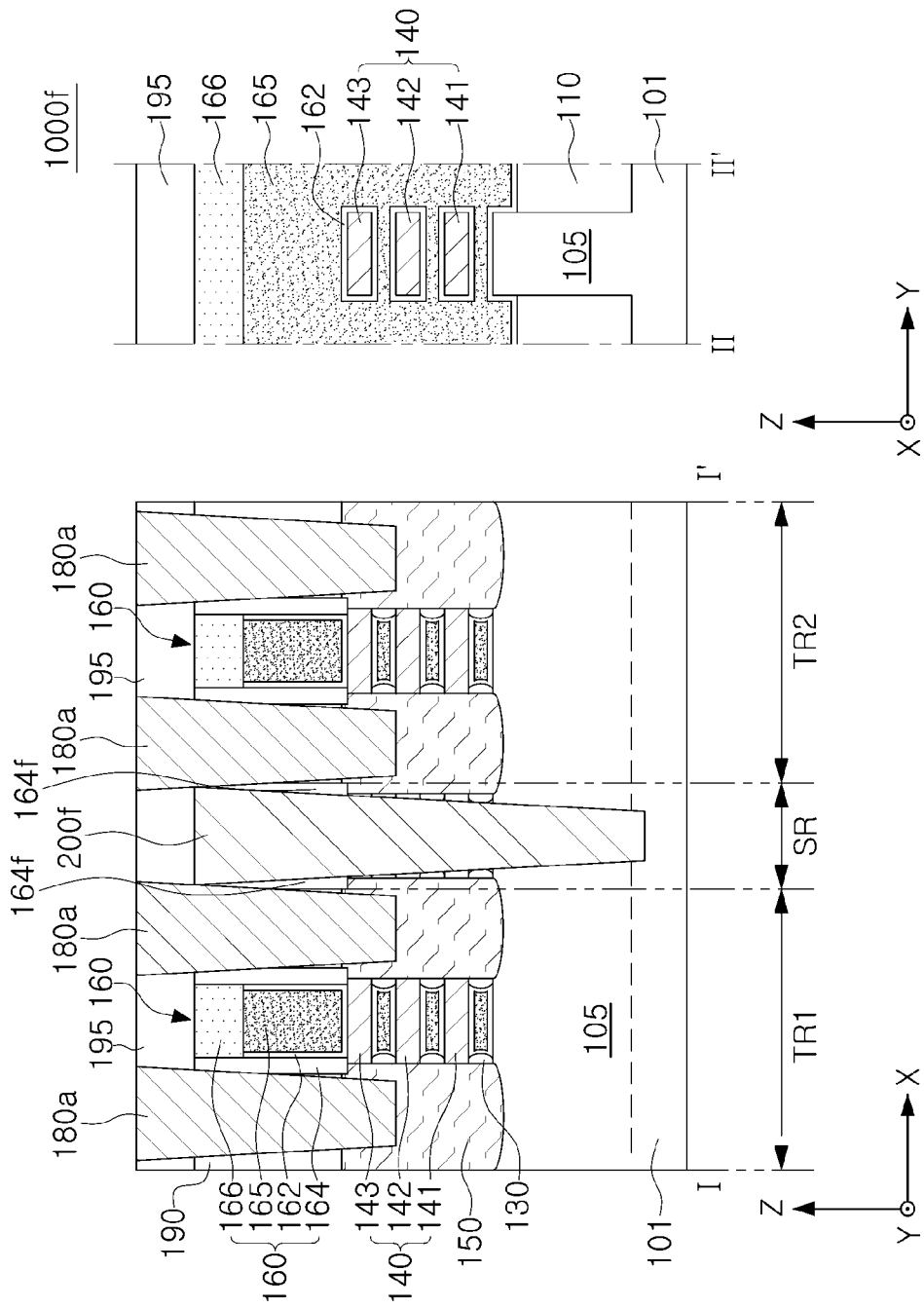
FIGS. 6 to 8 are cross-sectional views illustrating semiconductor devices according to example embodiments of the present inventive concept.

FIG. 6 is a cross-sectional view of a semiconductor device according to an example embodiment of the present inventive concept.

Referring to FIG. 6, unlike the example embodiment of the present inventive concept described above with reference to FIG. 2, a semiconductor device 1000f may include contact plugs 180a, each having a relatively larger width in the first direction (e.g., the X direction). Therefore, a portion of contact plugs 180a may be in contact with an edge of an upper surface of an isolation structure 200f. In example embodiments of the present inventive concept, the contact plugs 180a may have a shape bent along the upper surface of the isolation structure 200f. For example, the contact plugs 180a and the isolation structure 200f may each taper in the third direction (e.g., the Z direction) toward the substrate 101, thus isolation spacer layers 164f shaped like isosceles triangles may be disposed on the source/drain regions 150 and extend between adjacent side surfaces of the isolation structure 200f and the contact plugs 180a. The vertex angle of the isosceles triangle shaped isolation spacer layers 164f may be positioned at a lower surface of the upper insulating layer 195 where the contact plugs 180a and the isolation structure 200f contact. The contact plugs 180a may be in contact with source/drain regions 150. Unlike the example embodiment of the inventive concept described above with reference to FIG. 2, a contact area of the contact plugs 180a with the source/drain regions 150 may be increased. The contact plugs 180a may overlap portions of the gate spacer layers 164 and the isolation spacer layers 164f.

Figure 7:
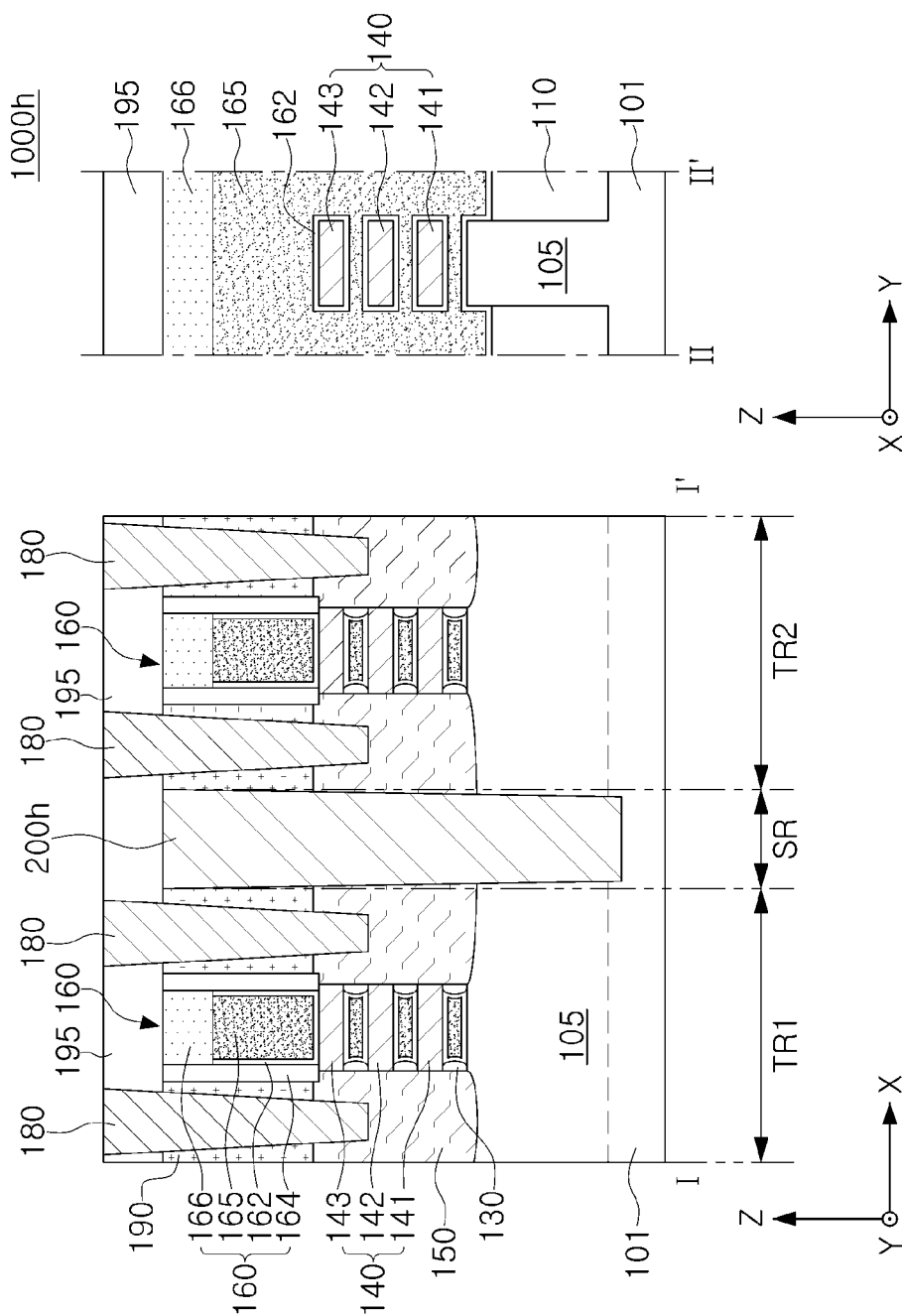

FIG. 7 is a cross-sectional view of a semiconductor device according to un example embodiment of the present inventive concept.

Referring to FIG. 7, unlike the example embodiment of the present inventive concept described above with reference to FIG. 2, a semiconductor device 1000h may include an isolation structure 200h which may be in contact with a lower insulating layer 190 and source/drain regions 150. In this example embodiment of the present inventive concept, the isolation structure 200h may be disposed in an area in which a channel structure 140 and a gate structure 160 are not disposed. Accordingly, isolation spacer layers 164a (see FIG. 2) may not be disposed on both side surfaces of the isolation structure 200h. For example, the isolation structure 200h may penetrate through the source/drain regions 150 between adjacent channel structures 140.

Figure 8:
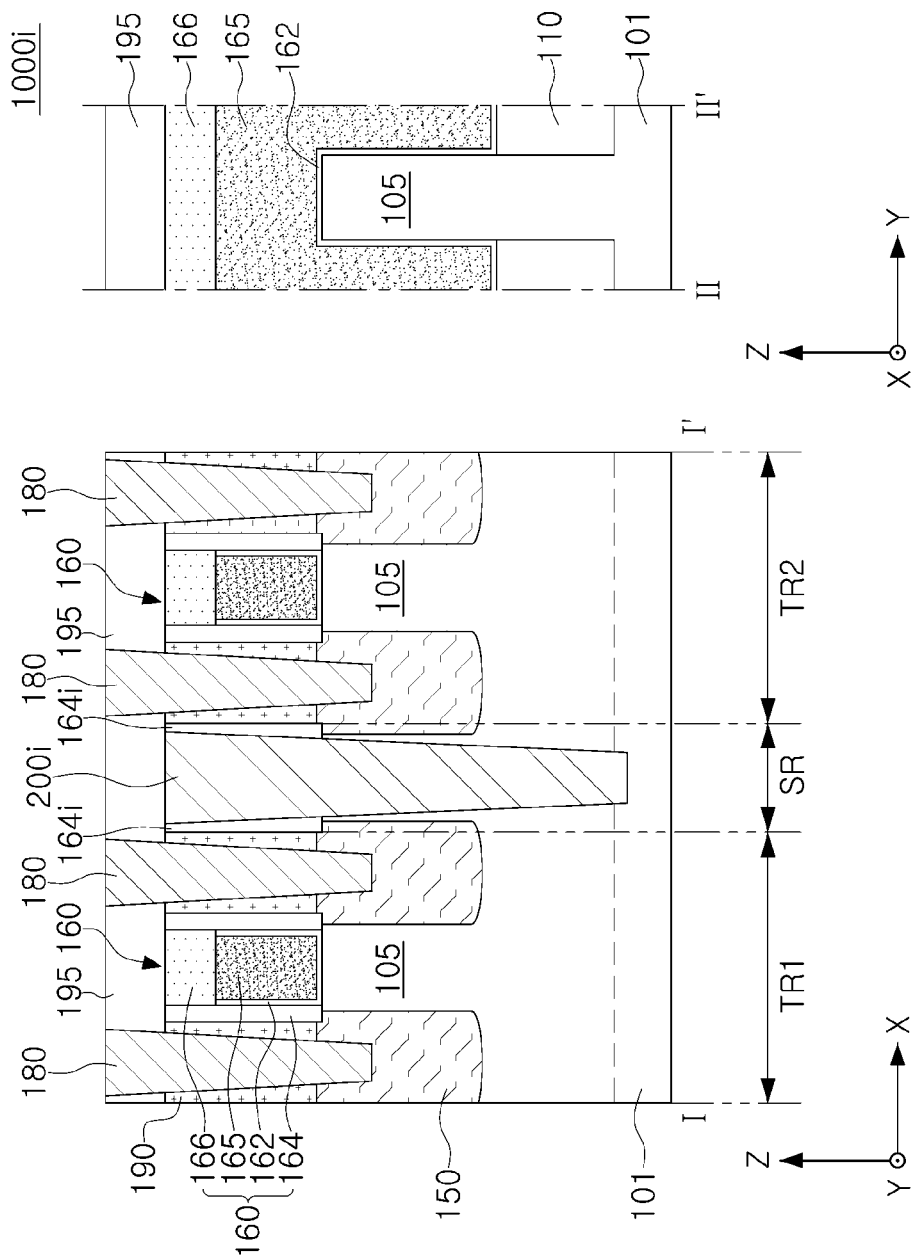

FIG. 8 is a cross-sectional view of a semiconductor device according to an example embodiment of the present inventive concept.

FIG. 8 illustrates cross sections of a semiconductor device 1000i including a FinFET in which a gate structure 160 surrounds three surfaces of an active region, for example, an upper surface of the active region 105 and side surfaces of the active region 105 in the second direction (e.g., the Y direction). Unlike the example embodiment described above with reference to FIG. 2, the semiconductor device 1000i may not include a plurality of channel layers. The semiconductor device 1000i may include a channel region, a portion of the active region 105, surrounded by the gate structure 160.

An isolation structure 200i may penetrate through a gate structure 160 and the channel region, and a lower end of the isolation structure 200i may be disposed to be lower them a lower end of the active region 105. Side surfaces of the isolation structure 200i may not be in contact with side surfaces of adjacent source/drain regions 150. For example, sidewalls of the isolation structure 200i may be covered by upwardly extending protrusions of the device isolation layer 110. The protrusions of the device isolation layer 110 may extend to a lower surface of the lower insulating laser 190 and may include a first sidewall adjacent to the isolation structure 200i with a complimentary angle, and a second external sidewall contacting the source/drain regions 150 which may be substantially perpendicular. However, unlike as illustrated in FIG. 8, the side surfaces of the isolation structure 200*i* may be in contact with side surfaces of adjacent source/drain regions 150. A lower portion of the isolation structure 200*i* may have a flat surface, a convex shape, or the like according to example embodiments of the present inventive concept, bin a shape of the lower of the isolation structure 200*i* is not limited thereto and may be variously changed.

Figure 9:
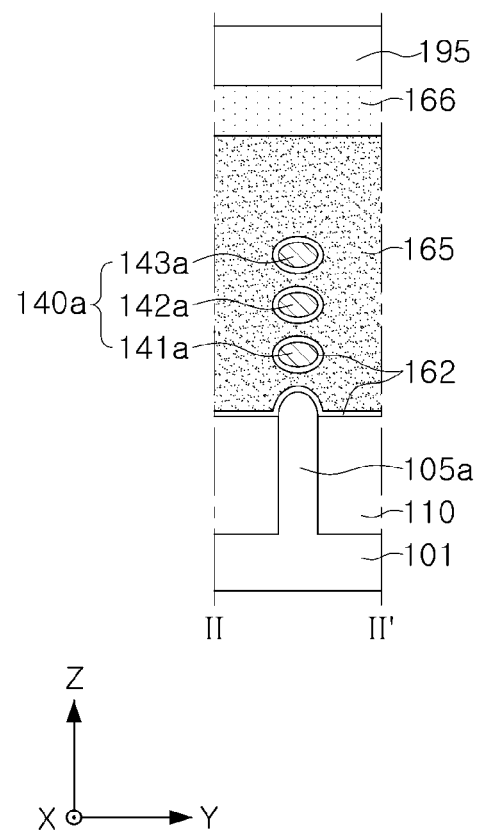
FIG. 9 is a partial cross-sectional view illustrating a semiconductor device according to example embodiments of the present inventive concept.

FIG. 9 is a cross-sectional view illustrating a semiconductor device according to an example embodiment of the present inventive concept.

Referring to FIG. 9, a semiconductor device 1000*j* may include an active region 105*a* and a channel structure 140*a*, each having a width different from that in the example embodiment of the present inventive concept described with reference to FIG. 2. Since each of the active region 105*a* and the channel structure 140*a* may have a relatively smaller width, each of a plurality of channel layers 141*a*, 142*a*, and 143*a* of the channel structure 140*a* may have a circular shape, or an elliptical shape in which a difference between lengths of a major axis and a minor axis is small, on a cross section in the second direction (e.g., the Y direction).

For example, in the example embodiment of the present inventive concept described with reference to FIG. 2, each of the plurality of channel layers 141, 142, and 143 may have a width of about 20 nm to about 50 nm in the second direction (e.g., the Y direction). In this exemplary embodiment of the present inventive concept, each of the plurality of channel layers 141*a*, 142*a*, and 143*a* may have a width of about 3 nm to about 12 nm in the second direction (e.g., the Y direction). As described above, in example embodiments of the present inventive concept, widths and the width-dependent shapes of the active region 105*a* and the channel structure 140*a* may be variously changed.

FIGS. 10 to 24 are cross-sectional views illustrating steps in a method of manufacturing a semiconductor device according to an example embodiment of the present inventive concept A method of manufacturing the semiconductor device in FIG. 2 according to an example embodiment of the present inventive concept will be described with reference to FIGS. 10 to 24.

Figure 10:
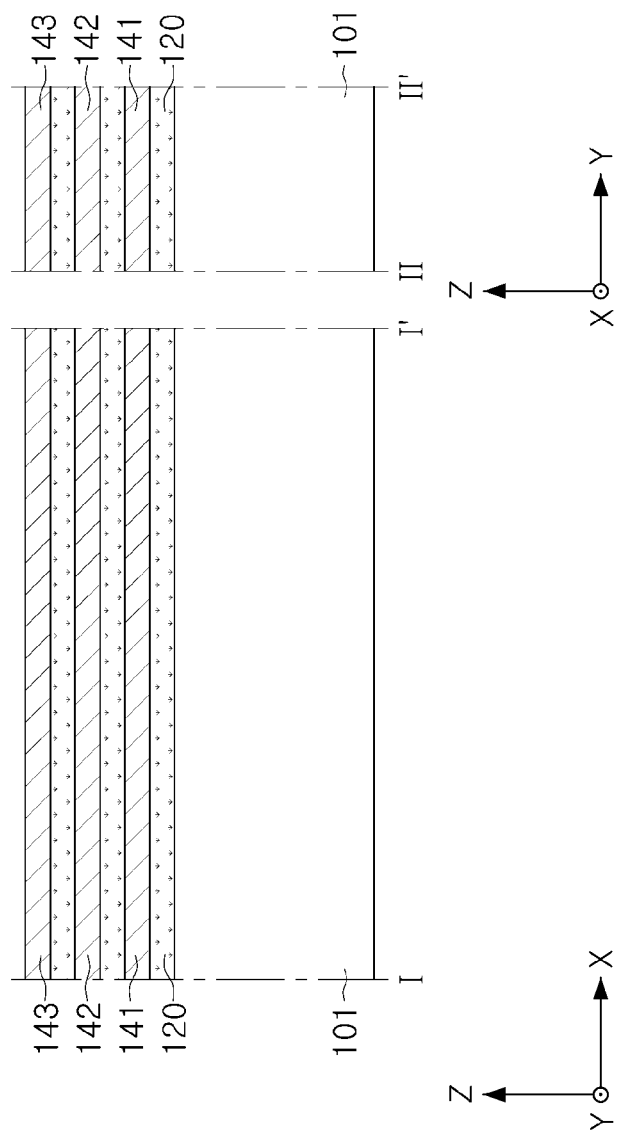
FIGS. 10 to 24 are cross-sectional views illustrating steps in a method of manufacturing a semiconductor device according to example embodiments of the present inventive concept.

Referring to FIG. 10, sacrificial layers 120 and channel layers 141, 142, and 143 may be alternately stacked on a substrate 101. For example, the channel layers 141, 142, and 143 may be sequentially slacked on a lowermost sacrificial layer 120 with additional sacrificial layers 120 disposed therebetween.

The sacrificial layers 120 may be layers to be replaced with gate dielectric layer 162 and gate electrode 165 through a subsequent process, as illustrated in FIG. 2. The sacrificial layers 120 may be formed of a material having a different etching selectivity with respect to channel layers 141, 142, and 143. The channel layers 141, 142, and 143 may include a material different from a material of the sacrificial layers 120. The sacrificial layers 120 and the channel layers 141, 142, and 143 include, for example, a semiconductor material including silicon (Si), silicon germanium (SiGe), and/or germanium (Ge), but may include materials different from each other. The sacrificial layers 120 and the channel layers 141, 142, and 143 may or may not include impurities. For example, the sacrificial layers 120 may include silicon germanium (SiGe), and the channel layers 141, 142, and 143 may include silicon (Si).

The sacrificial layers 120 and the channel layers 141, 142, and 143 may be formed by performing an epitaxial growth process using the substrate 101 as a seed. Each of the sacrificial layers 120 and the channel layers 141, 142, and 143 may have a thickness ranging from about 1 angstrom (Å) to about 100 nm. The number of layers of the channel layers 141, 142, and 143, stacked alternately with the sacrificial layer 120, may be variously changed according to example embodiments of the present inventive concept.

Figure 11:
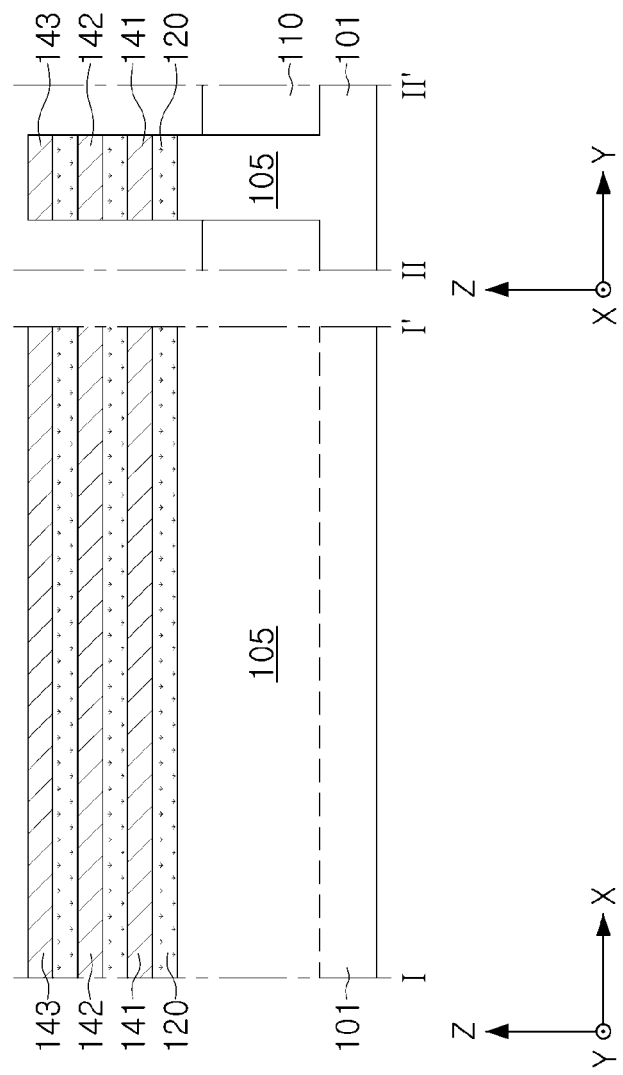

Referring to FIG. 11, active structures may be formed by removing a portion of the stacked structure of the sacrificial layers 120 and the channel layers 141, 142, and 143 and a portion of the substrate 101.

The active structure may include sacrificial layers 120 and channel layers 141, 142, and 143 alternately stacked on each other, and may further include an active region 105 formed to protrude from an upper surface of the substrate 101 by removing a portion of the substrate 101. The active structures may be formed in a line shape extending in the first direction (e.g., the X direction) and may be spaced apart from each other in the second direction (e.g., the Y direction).

In a region in which a portion of the substrate 101 is removed, device isolation layers 110 may be formed by filling an insulating material and recessing the insulating material such that the active region 105 protrudes. Upper surfaces of the device isolation layers 110 may be lower than upper surfaces of the active region 105.

Figure 12:
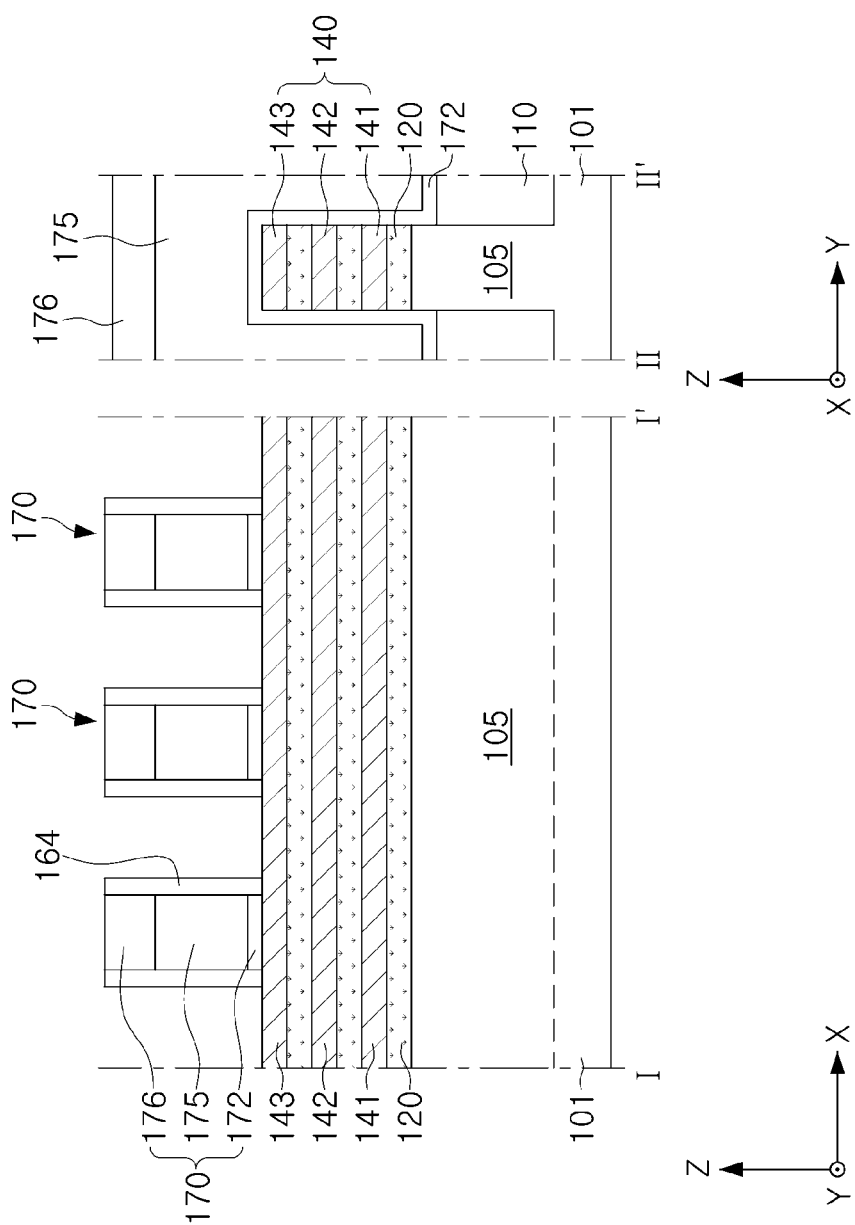

Referring to FIG. 12, sacrificial gate structures 170 and gate spacer layers 164 may be formed on the active structures.

The sacrificial gate structures 170 may be sacrificial structures formed in a region in which a gate dielectric layer 162 and a gate electrode 165 are disposed on the channel structures 140 through a subsequent process, as illustrated in FIG. 2. The sacrificial gate structure 170 may include first and second sacrificial gate layers 172 and 175 and a gate mask pattern layer 176, sequentially stacked. The first and second sacrificial gate layers 172 and 175 may be patterned using the gate mask pattern layer 176. The first and second sacrificial gate layers 172 and 175 may be respectively an insulating layer and a conductive layer, but are not limited thereto. The first and second sacrificial gate layers 172 and 175 may be formed as a single layer. For example, the first sacrificial gate layer 172 may include a silicon oxide, and the second sacrificial gate layer 175 may include polysilicon. The gate mask pattern layer 176 may include a silicon oxide and or a silicon nitride. The sacrificial gate structures 170 may have a line shape extending in one direction intersecting the active structures. The sacrificial gate structures 170 may extend, for example, in the second direction (e.g., the Y direction) and may be spaced apart front each other in the first direction (e.g., the X direction).

Gate spacer layers 164 may be formed on both sidewalls of the sacrificial gate structures 170. The gate spacer layers 164 may be formed by forming a layer having a uniform thickness along upper and side surfaces of the sacrificial gate structures 170 and the active structures and anisotropically etching the layer. The gate spacer layers 164 may be formed of a low-k dielectric and may include SiO, SiN, SiCN, SiOC, SiON, and or SiOCN.

Figure 13:
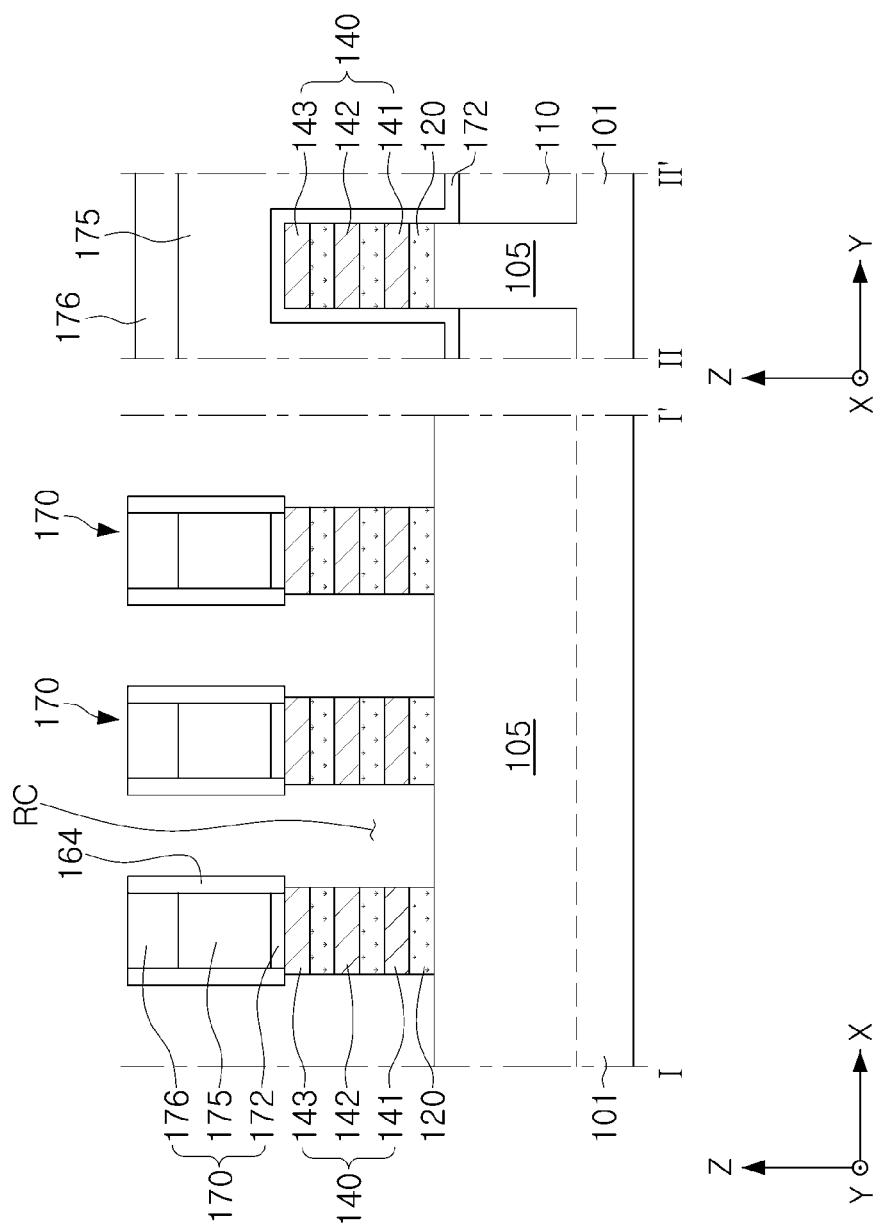

Referring to FIG. 13, the exposed sacrificial layers 120 and the exposed channel layers 141, 142, and 143 may be removed between the sacrificial gale structures 170 to form a recessed region RC, and thus, channel structures 140 may be formed.

The exposed sacrificial layers 120 and the exposed channel layers 141, 142, and 143 may be removed using the sacrificial gate structures 170 and the gate spacer layers 164 as masks. Thus, the channel layers 141, 142, and 143 have a limited length in the first direction (e.g., the X direction) and may constitute the channel structure 140. As described in the example embodiment of the present inventive concept depicted in FIG. 13, portions of the sacrificial layers 120 and the channel structure 140 may be removed below the sacrificial gate structures 170, such that both side surfaces thereof in the first direction (e.g., the X direction) may be disposed below the sacrificial gate structures 170 and the gate spacer layers 164.

Figure 14:
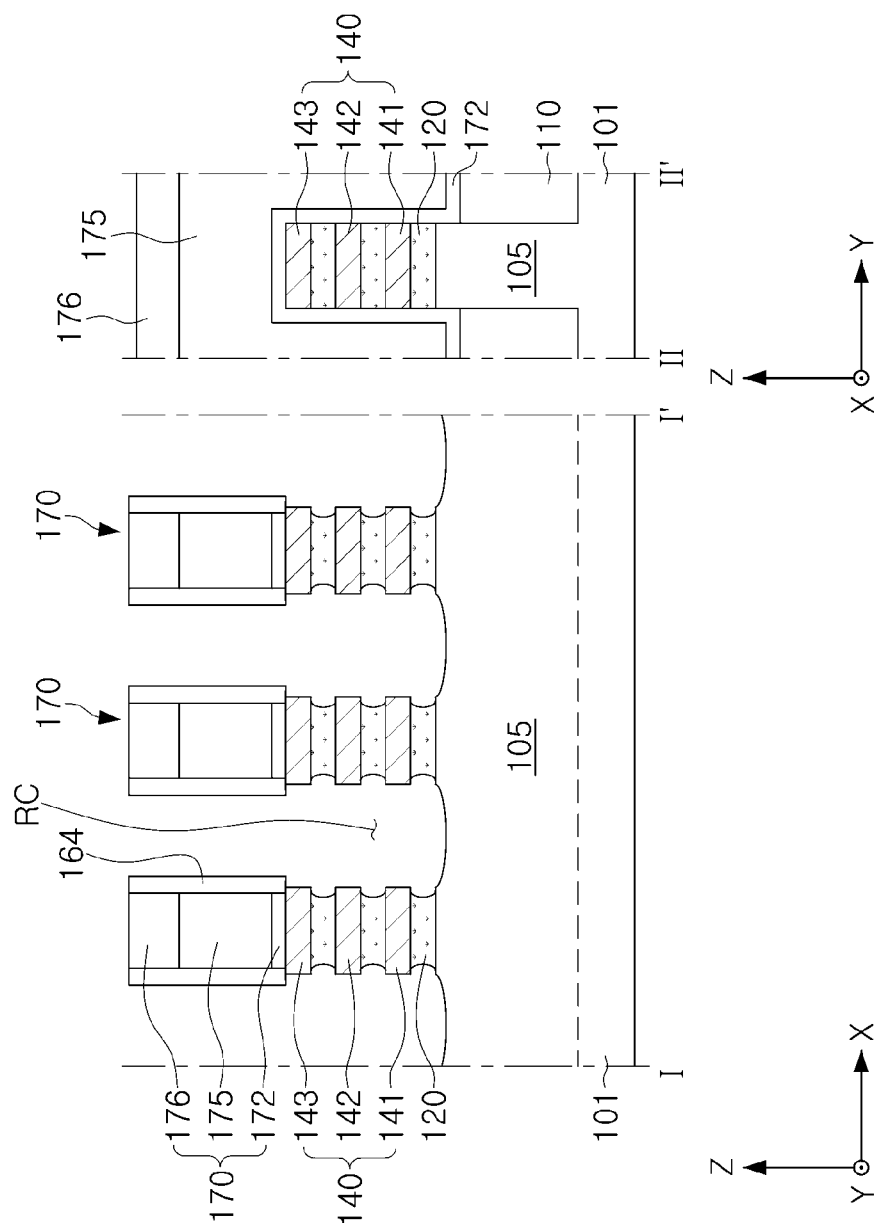

Referring to FIG. 14, a portion of the exposed sacrificial layers 120 may be removed from side surfaces thereof.

The sacrificial layers 120 may be selectively etched with respect to the channel structures 140 by, for example, by a wet etching process, to remove portions of side surfaces thereof to a predetermined depth in the first direction (e.g., the X direction). The sacrificial layers 120 may have inwardly concave side surfaces due to the side surface etching. However, the shape of the side surfaces of the sacrificial layers 120 is not limited to the shape illustrated in FIG. 14.

Figure 15:
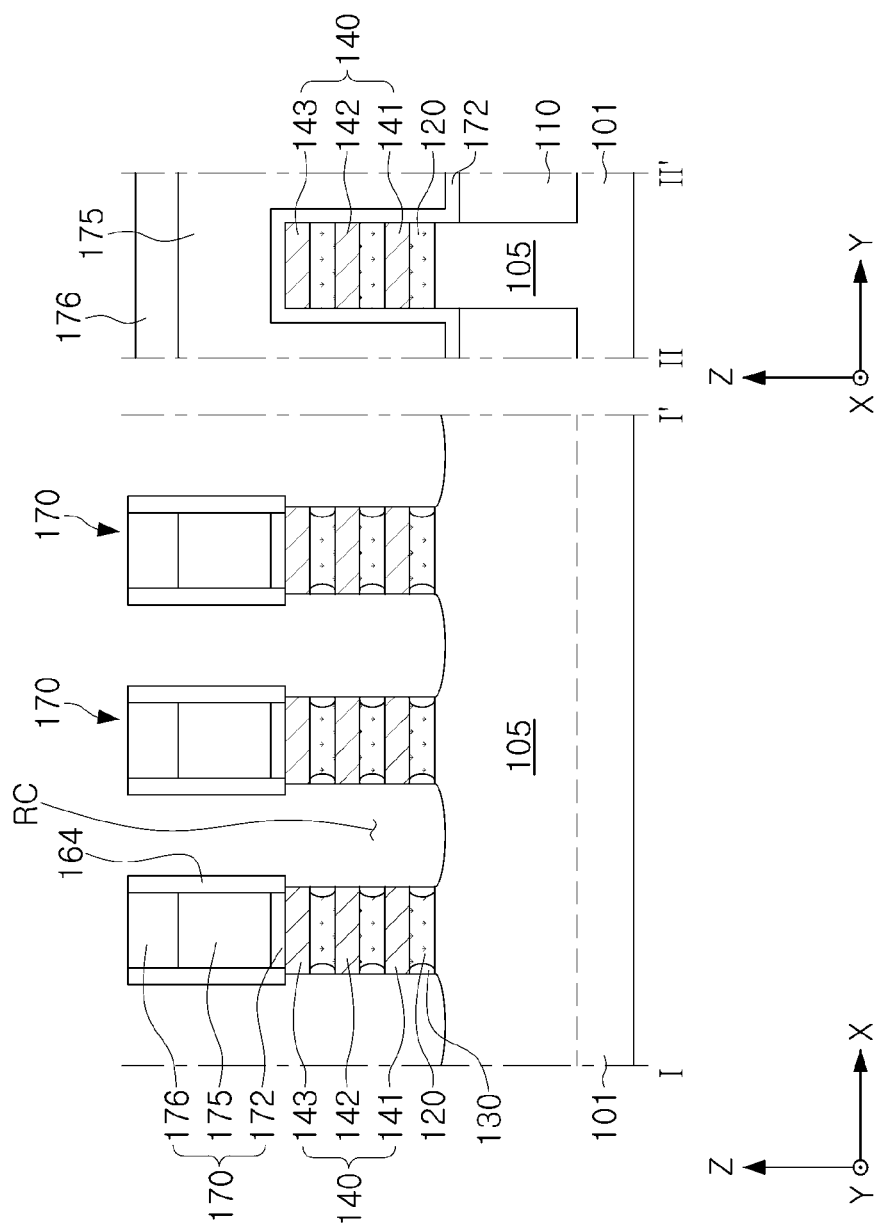

Referring to FIG. 15, internal spacer layers 130 may be formed in a region in which the sacrificial layers 120 are removed.

The internal spacer layers 130 may be formed by filling an insulating material in the region, in which the sacrificial layers 120 are removed, and removing the insulating material deposited on an external side of the channel structures 140. The internal spacer layers 130 may be formed of the same material as the gate spacer layers 164, but a material of the internal spacer layers 130 is not limited thereto. For example, the internal spacer layers 130 may include SiN, SiCN, SiOCN, SiBCN, and/or SiBN.

Figure 16:
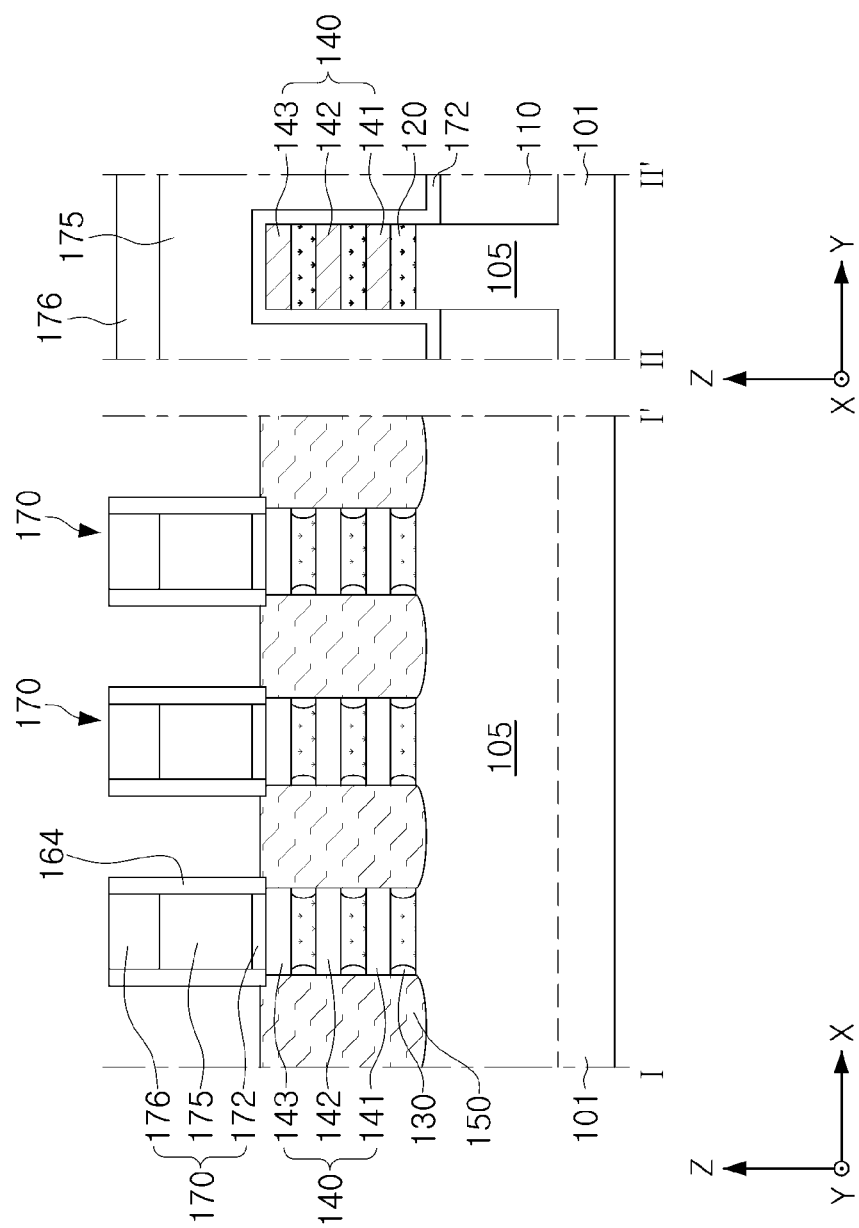

Referring to FIG. 16, source/drain regions 150 may be formed on active regions 105 on opposite sides adjacent to the sacrificial gate structures 170.

The source/drain regions 150 may be formed by performing an epitaxial growth process. The source/drain regions 150 may be connected to the plurality of channel layers 141, 142, and 143 of the channel structures 140 through side surfaces of the source/drain regions 150, and may be in contact with the internal spacer layers 130 between the channel layers 141, 142, and 143. The source/drain regions 150 may include impurities formed by in-situ doping and may include a plurality of layers having doping elements different from each other and/or doping concentrations different from each other.

Figure 17:
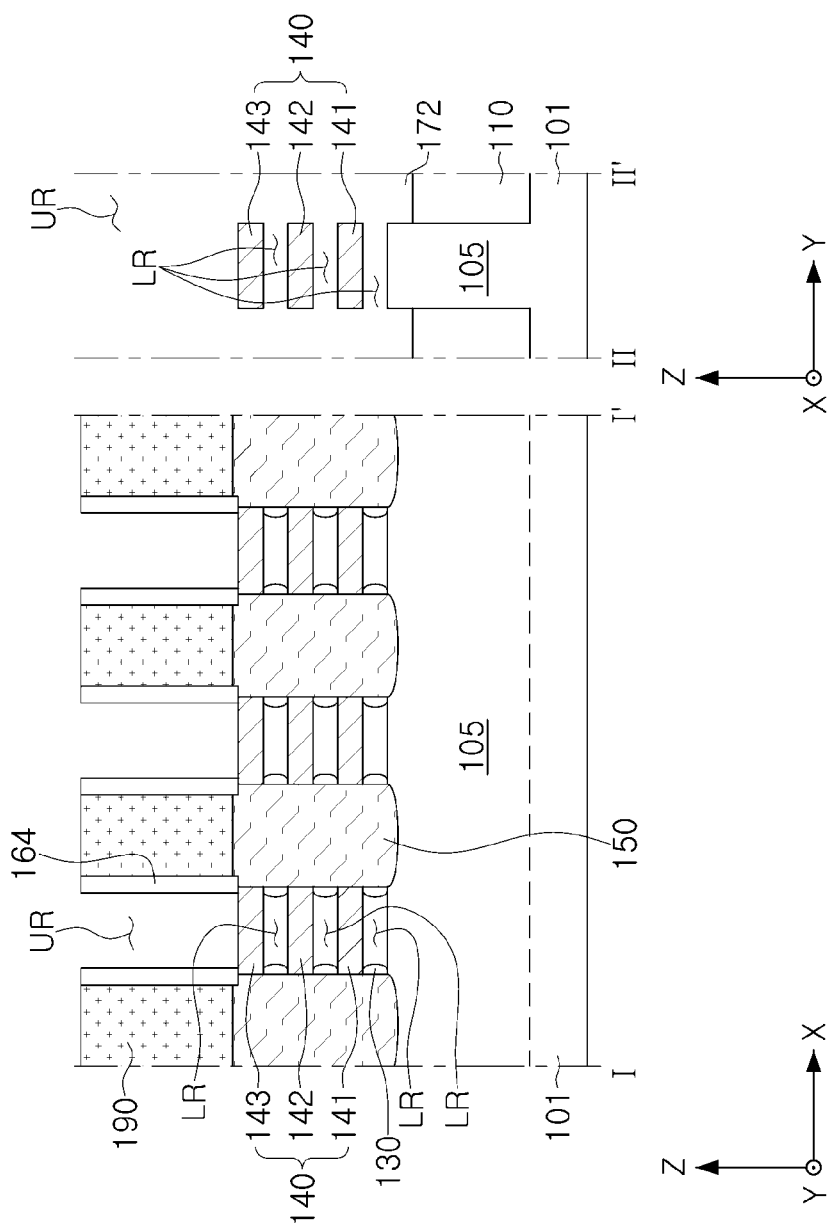

Referring to FIG. 17, a lower insulating layer 190 may be formed, and the sacrificial layers 120 and the sacrificial gate structures 170 may be removed.

The lower insulating layer 190 may be formed by forming an insulating layer to cover the sacrificial gate structures 170 and the source/drain regions 150 and performing a planarization process.

The sacrificial layers 120 and the sacrificial gate structures 170 may be selectively removed with respect to the gate spacer layers 164, the lower insulating layer 190, and the channel structures 140. After upper gap regions UR may be formed by removing the sacrificial gate structures 170, lower gap regions LR may be formed by removing the sacrificial layers 120 exposed through the upper gap regions UR. For example, when the sacrificial layers 120 include silicon germanium (SiGe) and the channel structures 140 include silicon (Si), the sacrificial layers 120 may be selectively removed by performing a wet etching process using a peracetic acid as an etchant. During the removal process, the source/drain regions 150 may be protected by the lower insulating layer 190 and the internal spacer layers 130.

Figure 18:
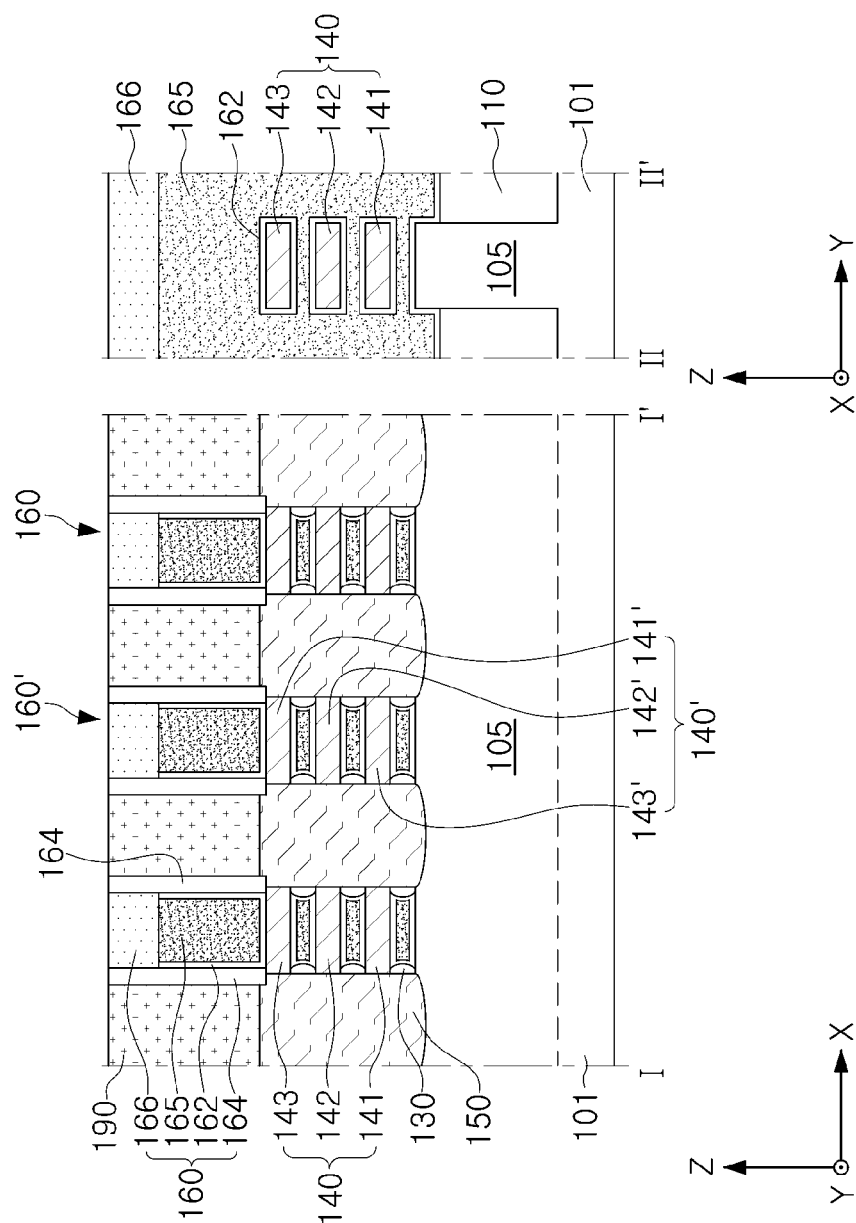

Referring to FIG. 18, gate structures 160 may be formed in the upper gap regions UR and the lower gap regions LR.

The gate dielectric layers 162 may be formed to conformally cover internal surfaces of the upper gap regions UR and the lower gap regions LR. After the gate electrodes 165 may be formed to completely fill the upper gap regions UR and the lower gap regions LR, the gate electrode 165 may be removed from an upper portion thereof to a predetermined depth in the upper gap regions UR. Gate capping layer 166 may be formed in a region in which the gate electrodes 165 are removed from the upper gap regions UR. Accordingly, gate structures 160 including the gate dielectric layer 162, the gate electrode 165, the gate spacer layers 164, and the gate capping layer 166 may be formed.

At least one of the gate structures 160 may be a dummy gate structure 160' having a portion to be removed in a subsequent process. At least one of the channel structures 140 may be a dummy channel structure 140', corresponding to the dummy gate structure 160', having a portion to be removed together with the dummy gate structure 160' in a subsequent process.

Figure 19:
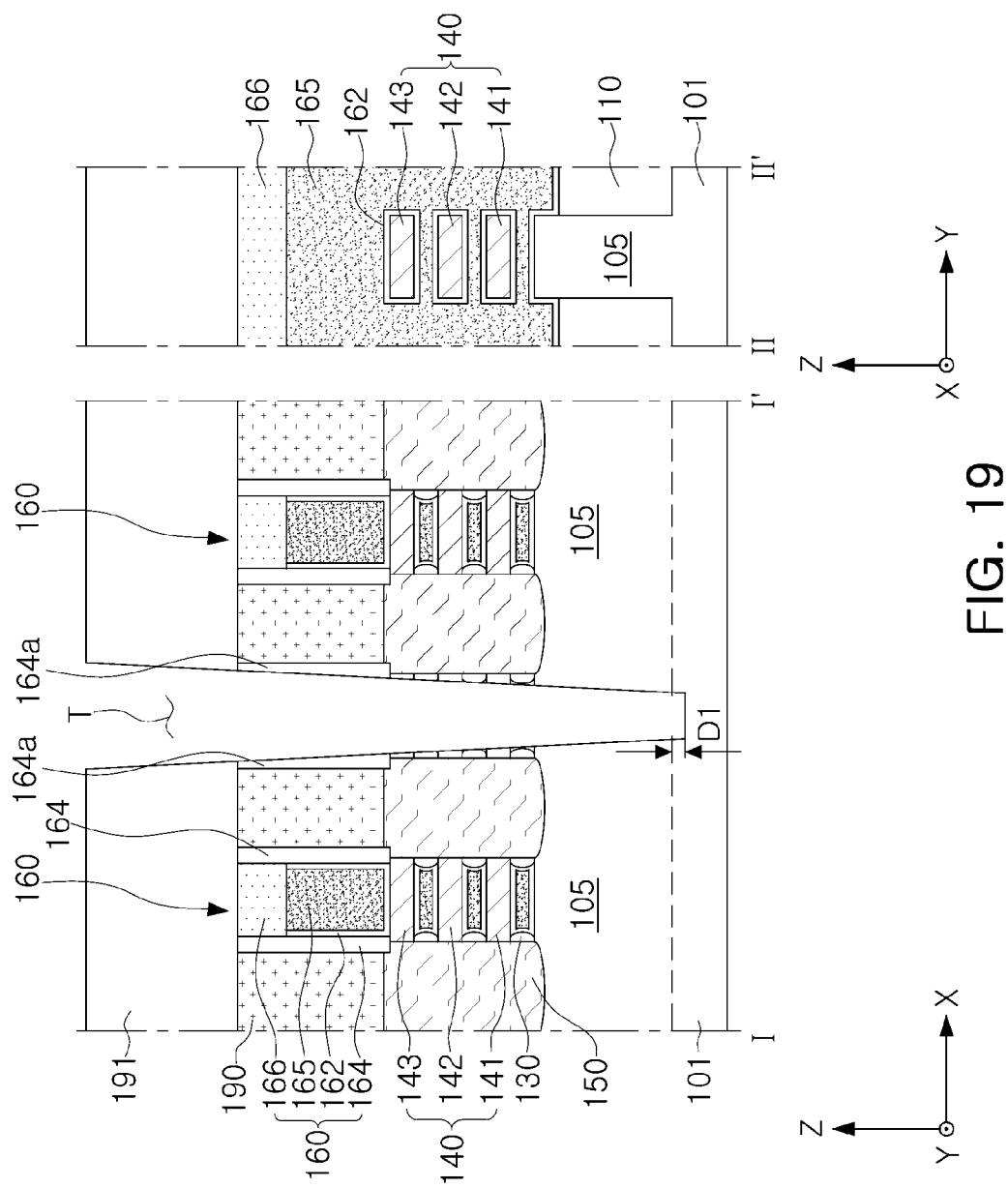

Referring to FIG. 19, a first mask pattern layer 191 may be formed on the gate structures 160 and the lower insulating layer 190, and a trench may be formed to extend downwardly below a lower end of the active region 105 through the first mask pattern layer 191, the dummy gate structure 160', and the dummy channel structure 140'. Thus, a portion of the dummy gate structure 160' and a portion of the dummy channel structure 140' may be removed.

The first mask pattern layer 191 may include a compound including silicon. For example, the first mask pattern layer 191 may include tetraethyl orthosilicate (TEOS).

The trench T may extend in the second direction (e.g., the Y direction) intersecting the active region 105. The trench T may have an inclined side surface in which a width of a lower portion is narrower than a width of an upper portion according to an aspect ratio. The lower portion of the trench T may have a flat surface and may have a shape convex or sharp with respect to the substrate 101, but a shape thereof is not limited thereto. A lower end of the trench T may be disposed to be lower than the lower end of the active region 105 by a predetermined depth, for example, a first depth D1.

As the trench T is formed, unremoved portions of the dummy gate spacer layers 164' may remain as isolation spacers 164a on side surfaces of the trench T while removing portions of the dummy gate spacer layers 164' of the dummy gate structure 160'.

Figure 20:
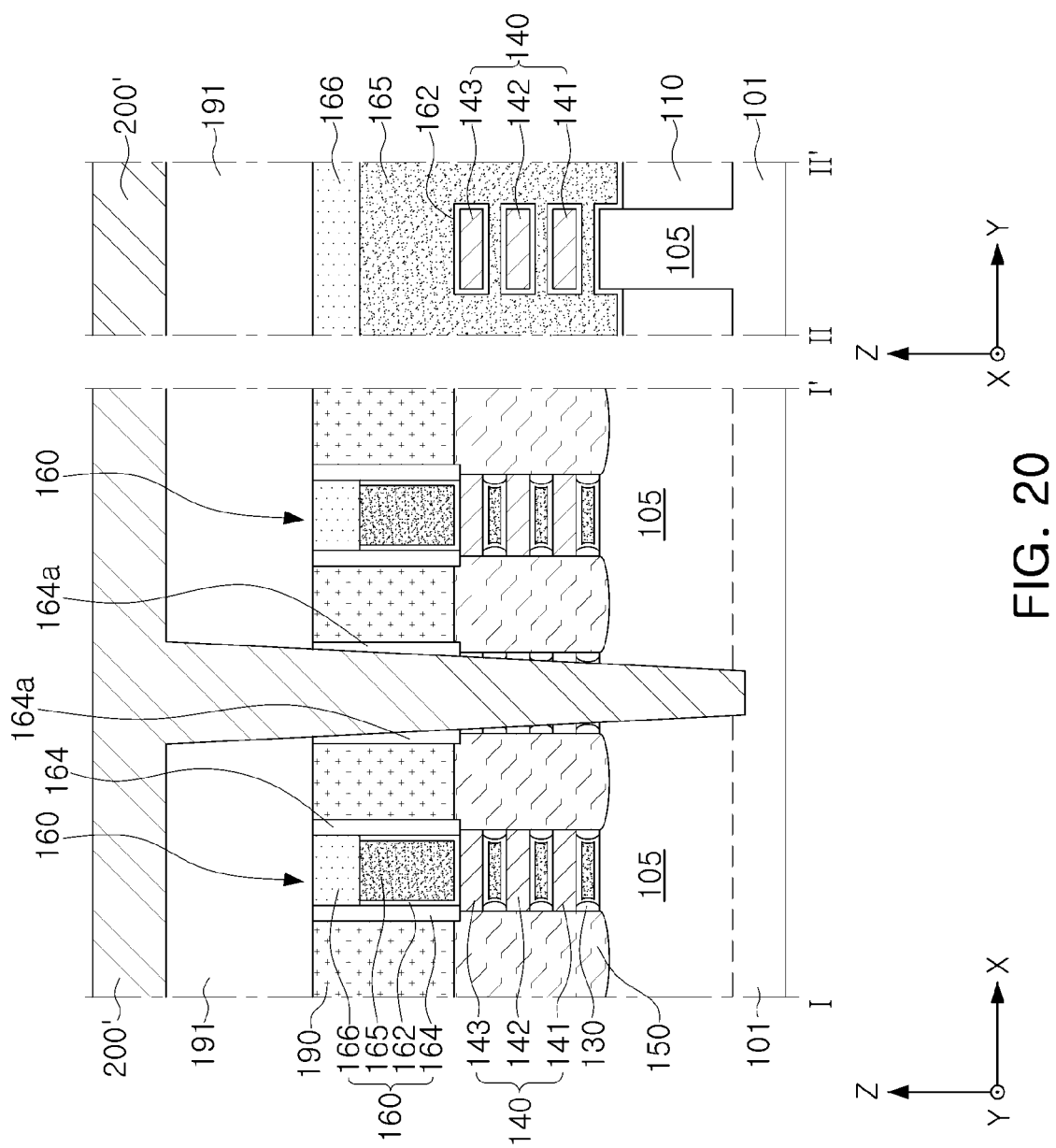

Referring to FIG. 20, a preliminary isolation structure 200' may be formed to fill the trench T and to cover an upper portion of the first mask pattern layer 191. The preliminary isolation structure 200' may include a material different from a material of the gate capping layer 166.

Figure 21:
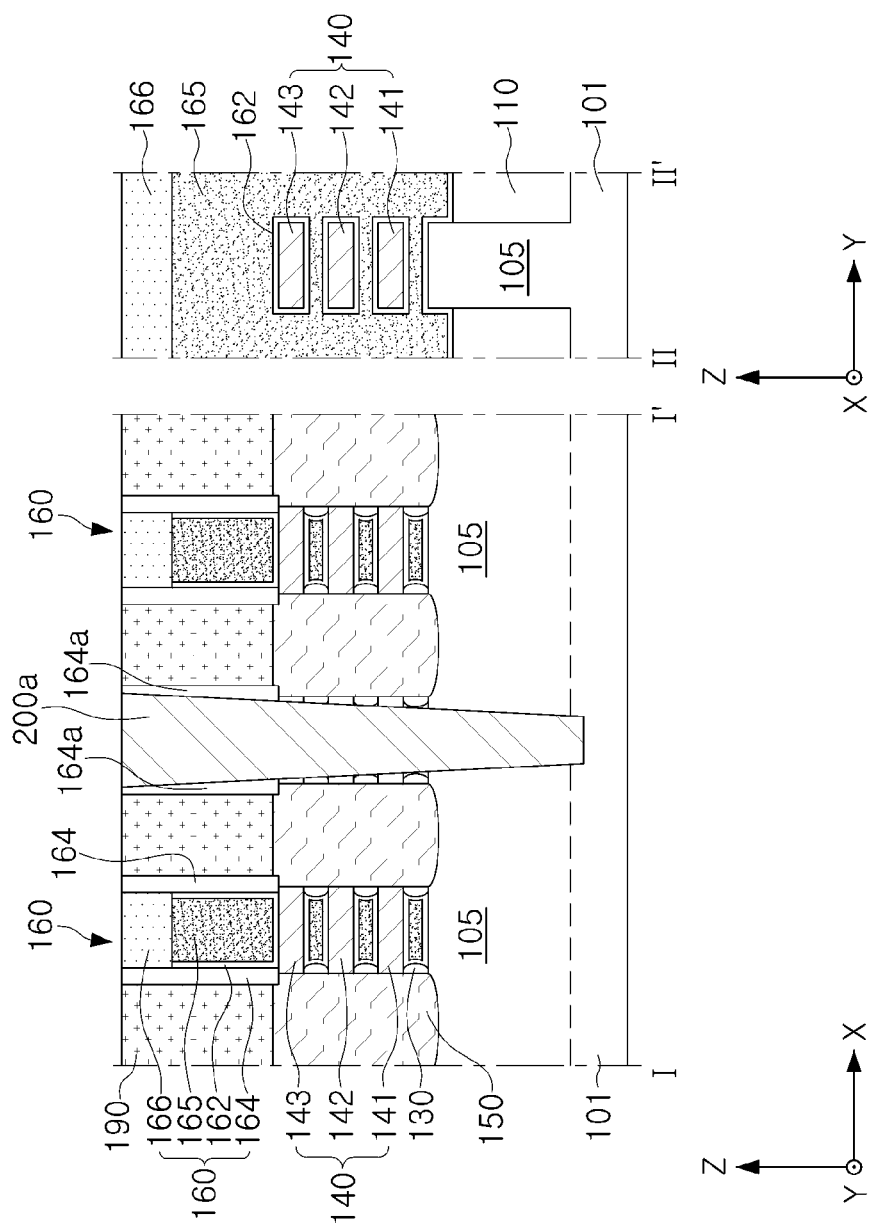

Referring to FIG. 21, portions of the first mask pattern layer 191 and the preliminary isolation structure 200' may be removed through a chemical mechanical polishing (CMP) process. The CMP process may be stopped by detecting a boundary between layers including materials different from each other. Thus, a height from the boundary to a surface, on which the CMP process is stopped, may be adjusted. In order to prevent a semiconductor device from failing in a subsequent process, the height is required to be smaller than a predetermined value. In an example embodiment of the present inventive concept, since a CMP process may be stopped by sensing the boundary between the first mask pattern layer 191 and the gate capping layer 166, the requirement may be satisfied. For example, according to example embodiments of the present inventive concept, since the preliminary isolation structure 200' includes a material different from a material of the gate capping layer

166, the boundary between the first mask pattern layer 191 and the gate capping layer 166 may be precisely detected in the CMP process. For example, both the preliminary isolation structure 200' and the first mask pattern layer 191, disposed at a level higher than the boundary between the first mask pattern layer 191 and the gate capping layer 166, may be removed. Accordingly, poor formation of a contact hole H, which may be caused by remnants of the preliminary isolation structure 200' in a subsequent process, may be prevented and a contact plug 180 having a uniform width may be formed.

Figure 22:
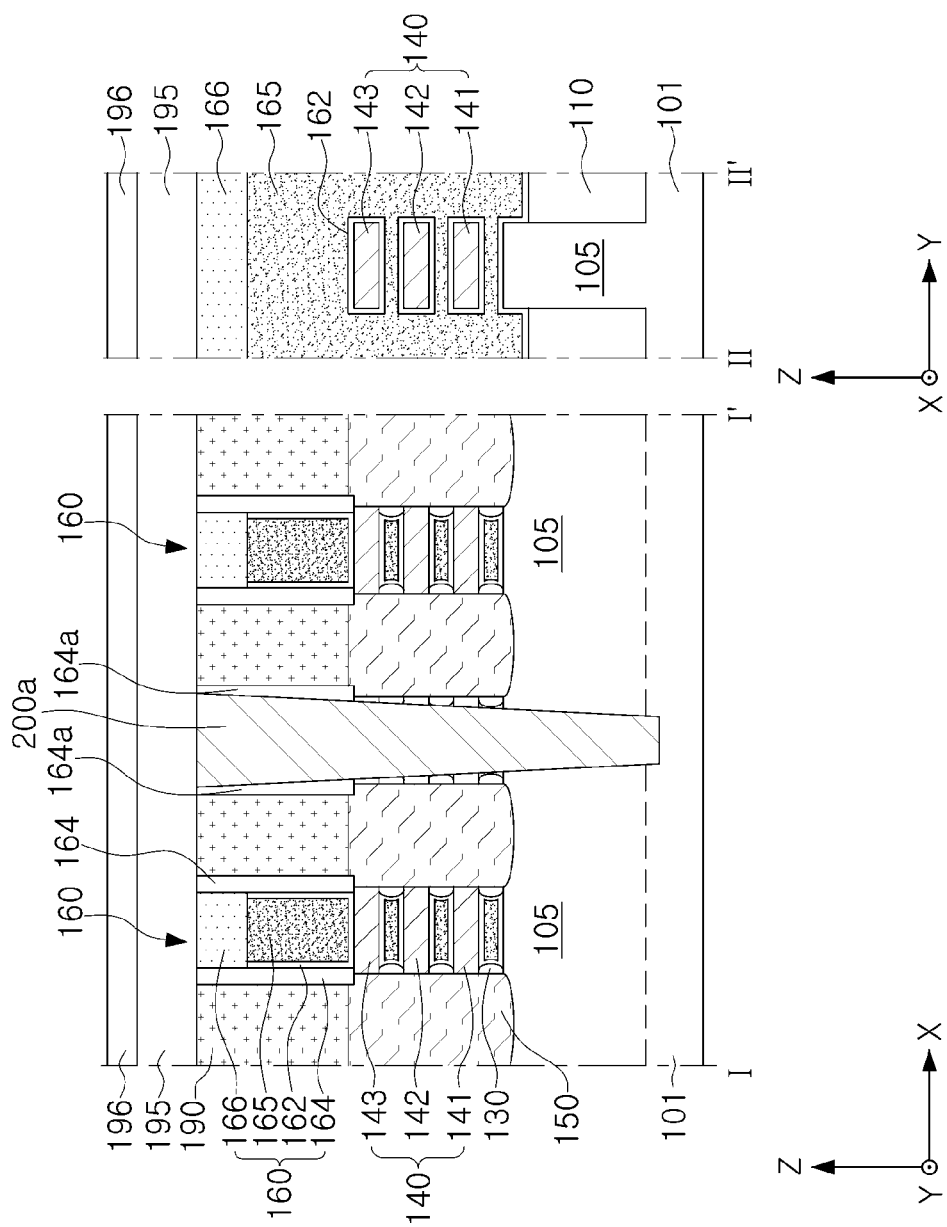
Figure 23:
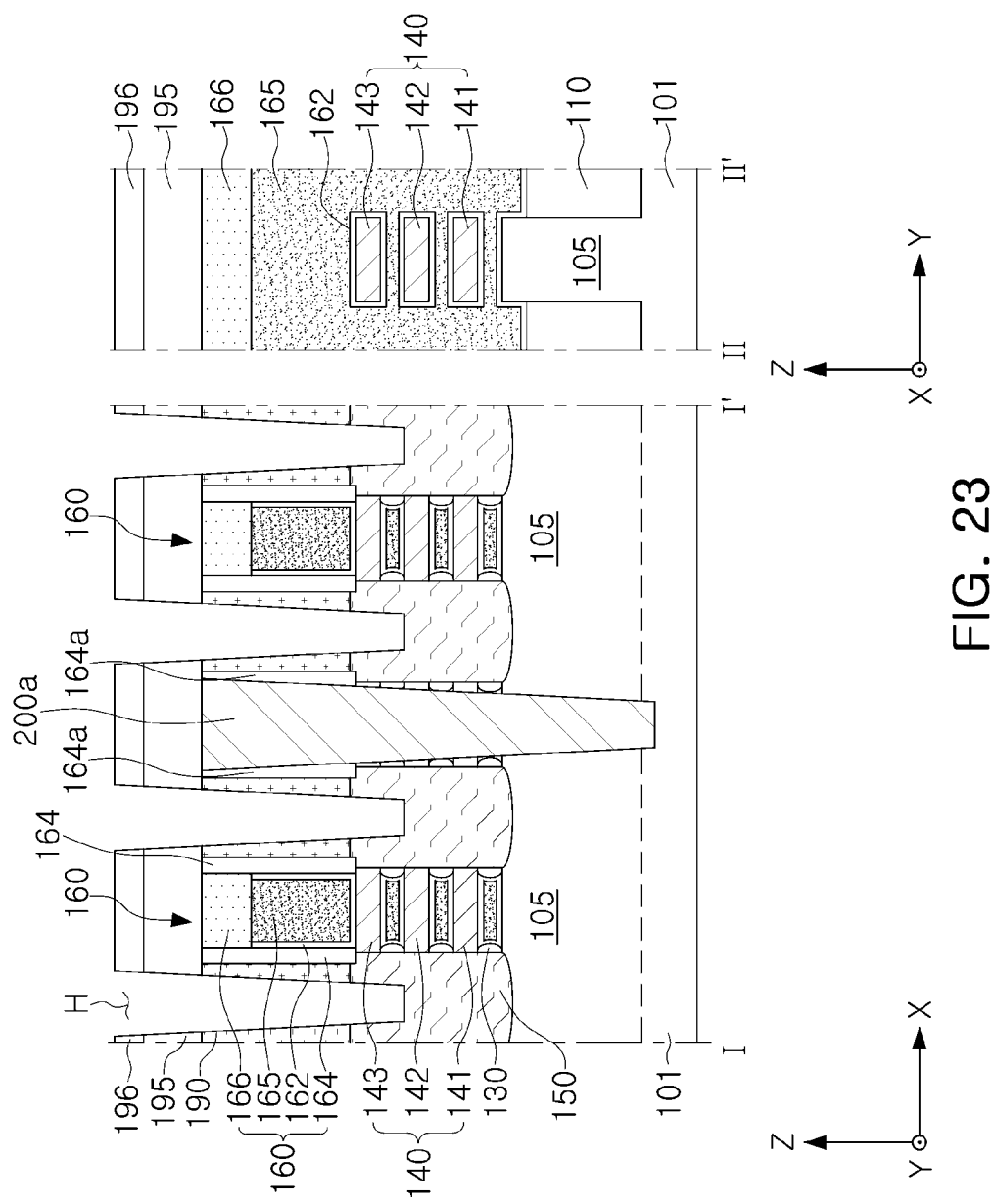
Figure 24:
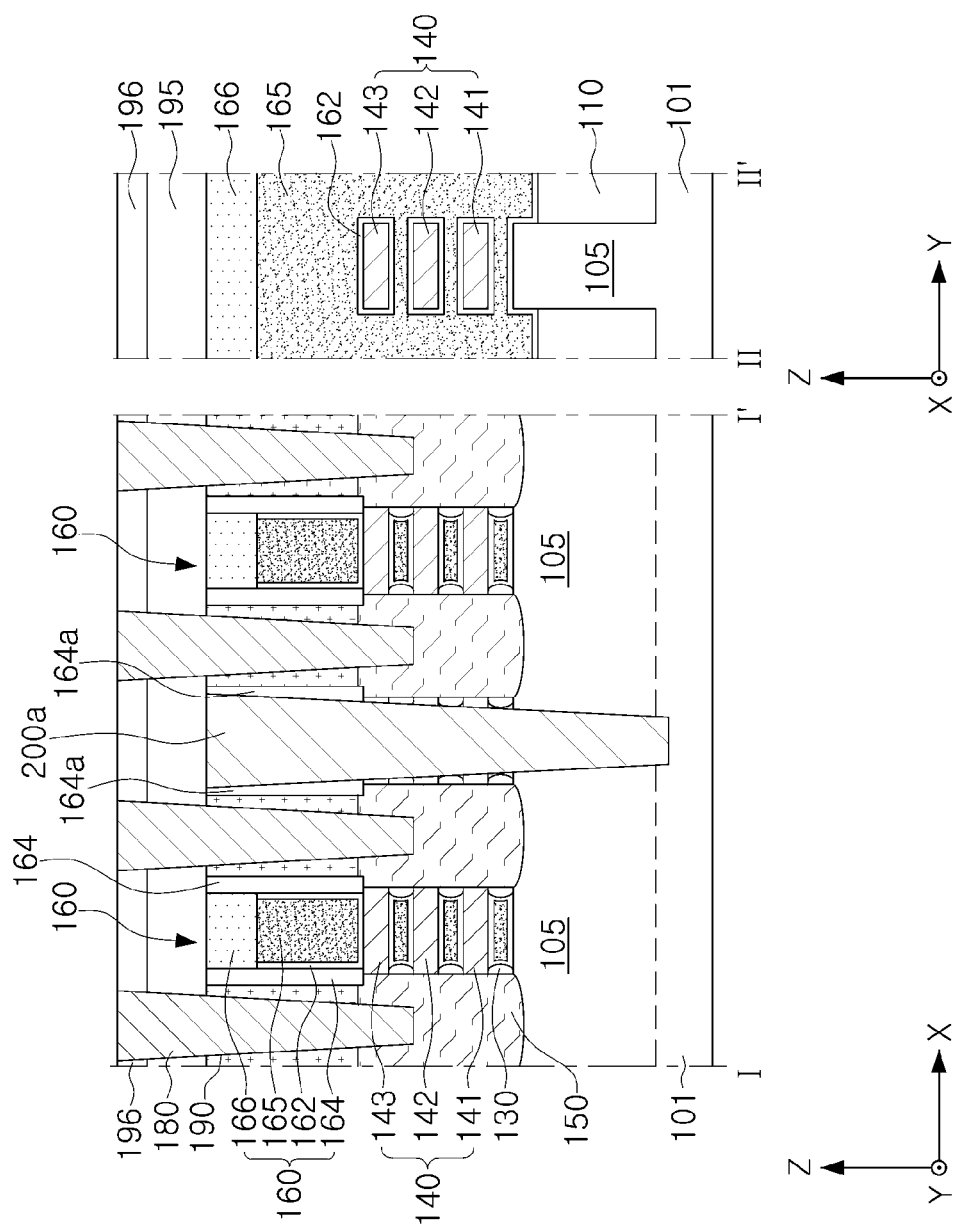

Referring to FIGS. 22 to 24, an upper insulating layer 195 and a second mask pattern 196 may be sequentially formed to cover upper portions of the gate structure 160, the lower insulating layer 190, and the isolation structure 200a.

A contact hole H may be formed to penetrate through the second mask pattern 196, the upper insulating layer 195, and the lower insulating layer 190 and to recess upper portions of the source/drain regions 150.

A conductive material fills the contact hole H to form the contact plug 180. A lower surface of the contact hole H may be recessed into the source/drain regions 150 or may be curved along upper surfaces of the source/drain regions 150. In example embodiments of the present inventive concept, a shape and a disposition of the contact plug 180 may be variously changed.

In a semiconductor device according to example embodiments of the present inventive concept, a dielectric material of an isolation structure is different from a dielectric material of a gate capping layer and/or a dielectric material of a lower insulating layer.

Accordingly, an upper surface of the gate capping layer may be accurately detected during a CMP process, and the dielectric material of the isolation structure may be prevented from remaining in an upper region of the source/drain region in which a contact hole is formed. As a result, the electrical characteristics of a semiconductor device may be increased.

While example embodiments of the present invention have been shown and described above, it will be understood by those of ordinary skill in the art that various changes in form and details may be made therein without departing from the spirit and scope of the present invention, as defined by the following claims.

What it claimed is:

1. A semiconductor device, comprising:
    an active region extending primarily in a first direction on a substrate and protruding from the substrate in a vertical direction perpendicular to an upper surface of the substrate;
    a plurality of channel layers vertically spaced apart from each other on the active region;
    gate structures extending primarily in a second direction perpendicular to the first direction, the gate structures intersecting the active region and the plurality of channel layers on the substrate, the gate structures at least partially surrounding the plurality of channel layers;
    source/drain regions disposed on the active region on at least one side of the gate structures, the source/drain regions in contact with the plurality of channel layers;
    a lower insulating layer disposed between side surfaces of the gate structures on the source/drain regions;
    contact plugs penetrating through the lower insulating layer, the contact plugs contacting the source-drain regions; and
    an isolation structure extending primarily in the second direction intersecting the active region on the substrate and disposed between the source/drain regions adjacent to each other,
    wherein the contact plugs extend below a top surface of the source/drain regions,
    wherein a first width of a lower portion of the isolation structure is smaller than a second width of an upper portion of the isolation structure, and the upper portion extends upwardly from the lower portion,
    wherein lower portion of the isolation structure recesses the active region to a depth greater than a thickness of one of the plurality of channel layers in the vertical direction to be in contact with side surfaces of the active region, and
    wherein each of the gate structures comprises a gate electrode and a gate capping layer on the gate electrode, and the isolation structure includes materials different from the gate capping layer.

2. The semiconductor device of claim 1, wherein the isolation structure includes SiOC and the gate capping layer includes SiN.

3. The semiconductor device of claim 1, wherein the isolation structure includes SiO, SiN, SiCN, SiOC, SiON, and/or SiOCN.

4. The semiconductor device of claim 1, wherein side surfaces of the isolation structure are in contact with the source/drain regions adjacent to each other.

5. The semiconductor device of claim 1, further comprising:
    a device isolation layer defining the active region and covering the upper surface of the substrate,
    wherein a lower end of the isolation structure is disposed below a level of a lower end of the device isolation layer.

6. The semiconductor device of claim 1, wherein each of the gate structures further comprises spacer layers disposed on side surfaces of the gate electrode.

7. The semiconductor device of claim 6, wherein upper surfaces of the spacer layers, an upper surface of the gate capping layer, and an upper surface of the isolation structure are substantially coplanar with each other.

8. The semiconductor device of claim 1, wherein at least a portion of the spacer layers is disposed on side surfaces of the isolation structure.

9. The semiconductor device of claim 1, further comprising:
    internal spacer layers disposed on opposite sides of the gate structure in the first direction and on lower surfaces of each of the plurality of channel layers, the internal spacer layers having external side surfaces substantially coplanar with external side surfaces of the plurality of channel layers.

10. The semiconductor device of claim 1, wherein the isolation structure is in contact with the lower insulating layer and the source/drain regions.

11. A semiconductor device, comprising:
    an active region protruding from a substrate in a vertical direction perpendicular to an upper surface of the substrate;
    a plurality of transistors, spaced apart front each other in a first direction on the active region, each of the plurality of transistors including a channel structure on the active region, gate structure at least partially surrounding the channel structure, source/drain regions in contact with the channel structure on the active region, and internal spacer layers disposed between the channel structures; and an isolation structure extending towards the active region, the isolation structure in contact with at least one of the gate structure, the channel structure, and the internal spacer layers, the isolation structure separating the plurality of transistors from each other, wherein a first width of a lower portion of the isolation structure is smaller than a second width of an upper portion of the isolation structure, and the upper portion extends upwardly from the lower portion, wherein the lower portion of the isolation structure recesses the active region to a depth greater than a thickness of one of the plurality of channel layers in the vertical direction to be in contact with side surfaces of the active region, wherein the gate structure comprises a gate electrode and a gate capping layer on the gate electrode, and an upper surface of the isolation structure is disposed higher than an upper surface of the gate electrode, and wherein the isolation structure includes materials different from the gate capping layer.

12. The semiconductor device of claim 11, wherein an upper surface of the gate capping layer is substantially coplanar with the upper surface of the isolation structure.

13. The semiconductor device of claim 11, wherein the gate structure further comprises gate spacer layers on side surfaces of the gate electrode, and each of the gate spacer layers has an upper surface substantially coplanar with an upper surface of the isolation structure.

14. The semiconductor device of claim 11, wherein a portion of side surfaces of the isolation structure is in contact with side surfaces of each of the source/drain regions.

15. The semiconductor device of claim 12, wherein a width of an upper surface of the isolation structure in the first direction is greater than a width of the gate electrode in the first direction.

16. The semiconductor device of claim 13, further comprising: isolation spacer layers disposed on side surfaces of the isolation structures and including the same material as the gate spacer layers.

17. The semiconductor device of claim 16, further comprising:
- contact plugs in contact with upper portions of the source/drain regions and overlapping a portion of the gate spacer layers,
- wherein at least one of the contact plugs is in contact with an edge of an upper surface of the isolation structure, and
- wherein the contact plugs extend below a top surface of the source/drain regions.

18. A semiconductor device, comprising:
an active region on a substrate and protruding from the substrate in a vertical direction perpendicular to an upper surface of the substrate;
a plurality of channel layers vertically spaced apart from each other on the active region;
gate structures including gate electrodes, the gate structures disposed on the active region;
a gate capping layer covering upper portions of the gate electrodes,
source/drain regions disposed on the active region on at least one side of the gate electrodes and disposed to be in contact with the plurality of channel layers; and
an isolation structure extending in the vertical direction, the isolation structure disposed on at least one side of the source/drain regions separating the source/drain regions adjacent to each other,
wherein a first width of a lower portion of the isolation structure is smaller than a second width of an upper portion of the isolation structure, and the upper portion extends upwardly from the lower portion,
wherein the lower portion of the isolation structure recesses the active region to a depth greater than a thickness of one of the plurality of channel layers in the vertical direction to be in contact with side surfaces of the active region, and
wherein the isolation structure includes a material different from a material of the gate capping layer.

19. The semiconductor device of claim 18, further comprising:
a device isolation layer defining the active region and covering the upper surface of the substrate; and
contact plugs contacting the source/drain regions, the contact plugs extending below a top surface of the source/drain regions,
wherein a lower end of the isolation structure is disposed below a level of a lower end of the device isolation layer, and
wherein the isolation structure includes SiOC and the gate capping layer includes SiN.

20. The semiconductor device of claim 18, further comprising:
gate spacer layers extending in the vertical direction, the gate spacer layers disposed on at least one side of the gate electrodes; and
isolation spacer layers extending in the vertical direction, the isolation spacer layers disposed on at least one side of the isolation structure,
wherein the isolation spacer layers are formed of the same material as the gate spacer layers.

* * * * *